(12) United States Patent
Lalancette et al.

(10) Patent No.: US 8,975,519 B2
(45) Date of Patent: Mar. 10, 2015

(54) ADJUSTABLE BRACKET FOR STEEL STUD

(71) Applicant: Thomas & Betts International, Inc., Wilmington, DE (US)

(72) Inventors: Daniel Lalancette, St-Jean-sur-Richelieu (CA); Marc-Antoine Veillette, Ange-Gardien (CA); Yves Boucher, St-Jean-sur-Richelieu (CA)

(73) Assignee: Thomas & Betts International, Inc., Wilmington, DE (US)

( * ) Notice: Subject to any disclaimer, the term of this patent is extended or adjusted under 35 U.S.C. 154(b) by 15 days.

(21) Appl. No.: 13/906,491

(22) Filed: May 31, 2013

(65) Prior Publication Data

US 2014/0008095 A1 Jan. 9, 2014

Related U.S. Application Data

(60) Provisional application No. 61/669,281, filed on Jul. 9, 2012.

(51) Int. Cl.
| | |
|---|---|
| *H01H 9/02* | (2006.01) |
| *H05K 5/02* | (2006.01) |
| *H02G 3/12* | (2006.01) |

(52) U.S. Cl.
CPC ............ *H05K 5/0204* (2013.01); *H02G 3/126* (2013.01)
USPC ............... 174/58; 174/57; 248/343; 248/300; 52/317

(58) Field of Classification Search
USPC .............. 248/343, 300; 174/57, 58; 52/317; 220/3.9
See application file for complete search history.

(56) References Cited

U.S. PATENT DOCUMENTS

| | | | |
|---|---|---|---|
| 1,857,787 A | 5/1932 | Meeks et al. | |
| 1,961,728 A | 6/1934 | Arnest et al. | |
| 3,378,160 A | * 4/1968 | Bassani .................... | 220/3.6 |
| 3,730,466 A | 5/1973 | Swanquist | |
| 4,140,293 A | 2/1979 | Hansen | |
| 4,214,668 A | 7/1980 | Neff et al. | |
| 4,447,030 A | 5/1984 | Nattel | |
| 4,787,587 A | 11/1988 | Deming | |
| 4,964,525 A | 10/1990 | Coffey et al. | |
| 4,971,280 A | 11/1990 | Rinderer | |
| 5,004,199 A | 4/1991 | Suk | |
| 5,005,792 A | 4/1991 | Rinderer | |
| 5,209,444 A | 5/1993 | Rinderer | |

(Continued)

FOREIGN PATENT DOCUMENTS

CA 2211583 A1 2/1999

*Primary Examiner* — Dhirubhai R Patel
(74) *Attorney, Agent, or Firm* — Snyder, Clark, Lesch & Chung, LLP

(57) ABSTRACT

An electrical box assembly includes an electrical box and a primary bracket. The primary bracket includes a first end panel for securing to a first surface of a stud; a second end panel for securing to a second surface of the stud and in a substantially parallel orientation to the first end panel; and mounting panel, joined to a first surface of the electrical box and located between the first end panel and the second end panel, the mounting panel having a length corresponding to a first stud depth. The primary bracket also includes an adaptation panel, between the mounting panel and the rear panel, having a length corresponding to a difference between the first stud depth and a second larger stud depth. The adaptation panel is selectively manipulated to position the front panel and the rear panel to accommodate either the first stud depth or the second stud depth.

23 Claims, 23 Drawing Sheets

(56) References Cited

U.S. PATENT DOCUMENTS

| | | | |
|---|---|---|---|
| 5,386,959 A | 2/1995 | Laughlin et al. | |
| 5,452,873 A | 9/1995 | Laughlin | |
| 5,595,362 A | 1/1997 | Rinderer et al. | |
| 5,810,303 A | 9/1998 | Bourassa et al. | |
| 6,389,658 B1 | 5/2002 | Pfaller et al. | |
| 6,484,979 B1 | 11/2002 | Medlin, Jr. | |
| 6,484,980 B2 | 11/2002 | Medlin, Sr. et al. | |
| 6,749,162 B2 | 6/2004 | Nicolides et al. | |
| 6,956,172 B2 | 10/2005 | Dinh | |
| 7,073,757 B2 | 7/2006 | Johnson et al. | |
| 7,087,837 B1 | 8/2006 | Gretz | |
| 7,173,184 B2 | 2/2007 | Hull et al. | |
| 7,214,876 B1 | 5/2007 | Haberek et al. | |
| 7,312,395 B1 | 12/2007 | Gretz | |
| 7,476,807 B1 | 1/2009 | Gretz | |
| 7,544,889 B1 | 6/2009 | Sanchez | |
| 7,628,286 B2 | 12/2009 | Lalancette | |
| 7,667,137 B1 | 2/2010 | Beckman | |
| 7,902,457 B2 | 3/2011 | Johnson | |
| 8,042,776 B2 | 10/2011 | Johnson | |
| 8,076,578 B1 | 12/2011 | Gretz | |
| 8,253,040 B2 * | 8/2012 | Hopkins | 174/503 |
| 2005/0127256 A1 | 6/2005 | Johnson et al. | |
| 2007/0057130 A1 | 3/2007 | Nikayin et al. | |
| 2010/0252552 A1 | 10/2010 | Nikayin et al. | |
| 2010/0288554 A1 | 11/2010 | Jafari | |

* cited by examiner

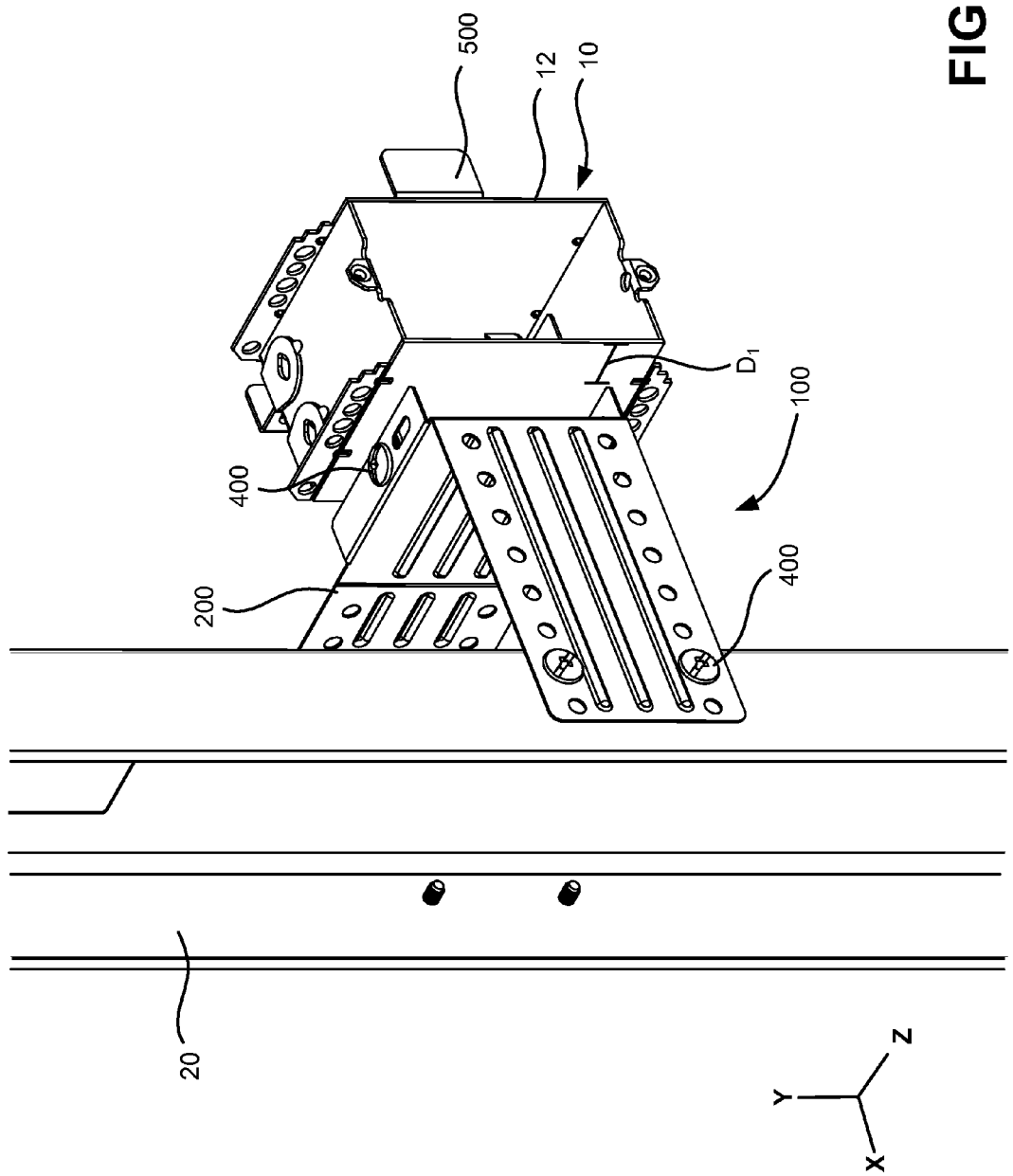

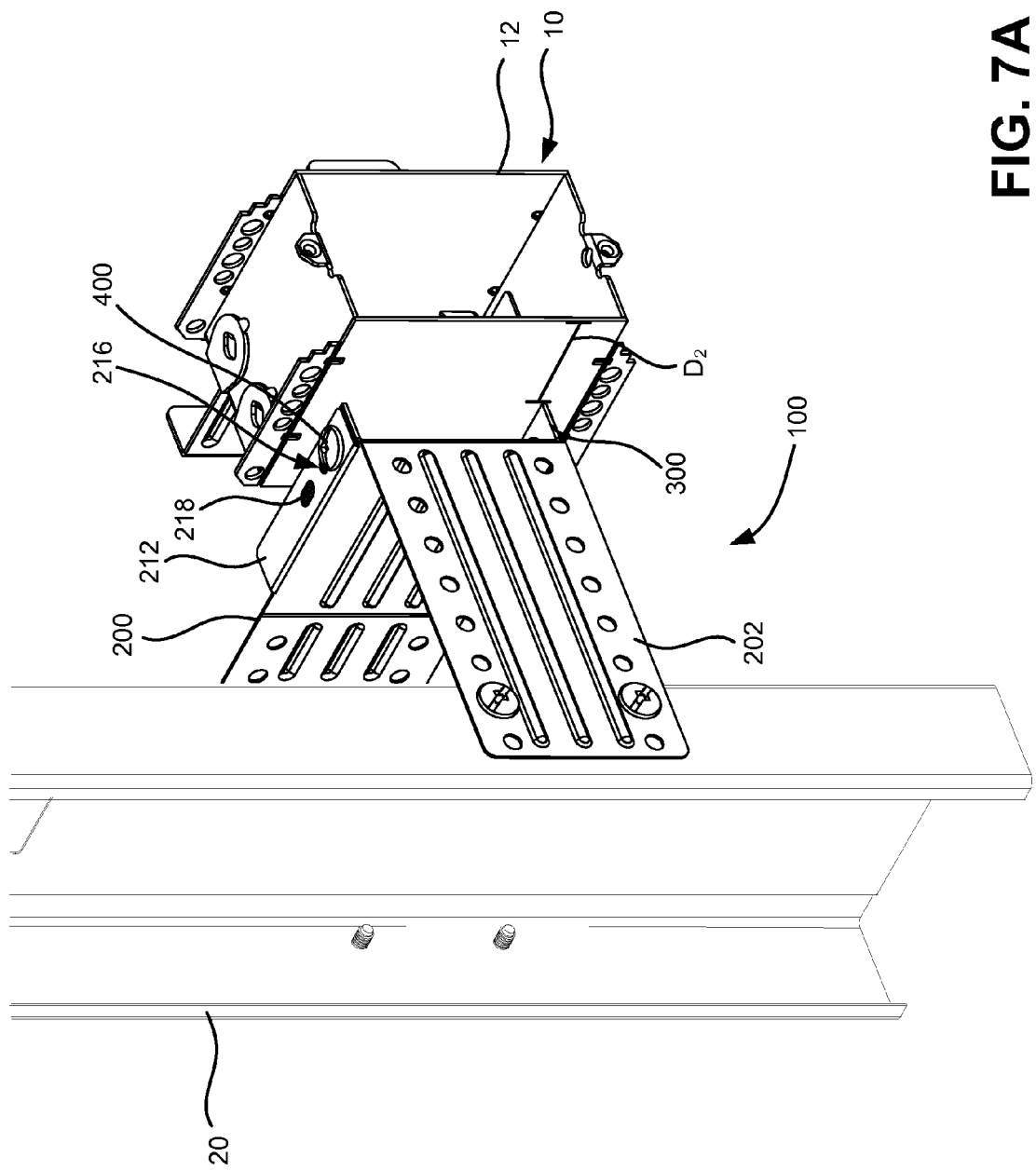

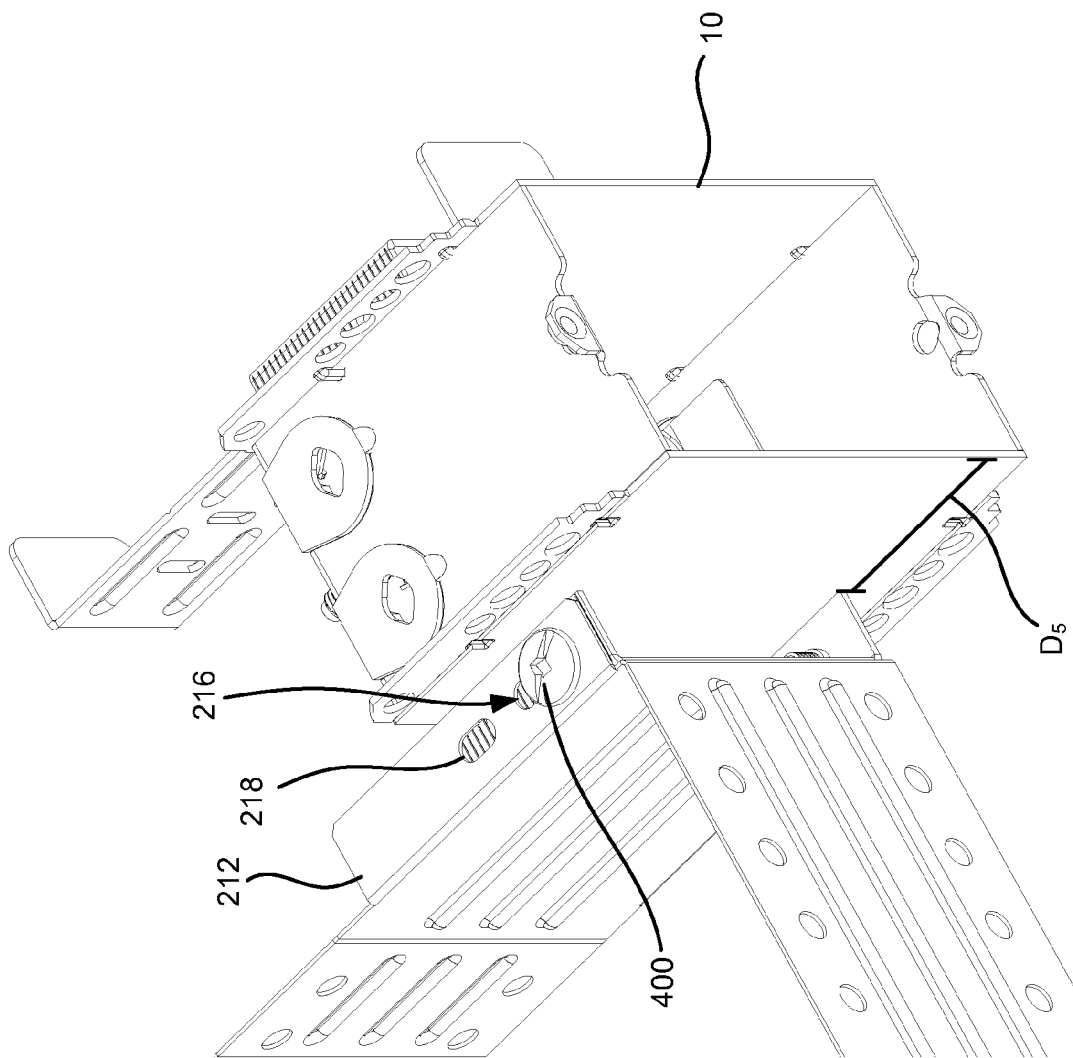

ADJUSTABLE BRACKET FOR STEEL STUD

CROSS-REFERENCE TO RELATED APPLICATION

This application claims priority under 35 U.S.C. §119, based on U.S. Provisional patent application No. 61/669,281 filed Jul. 9, 2012, the disclosure of which is hereby incorporated by reference herein.

BACKGROUND INFORMATION

Electrical boxes are required to be installed within a wall surface such that the front face of the electrical box is generally flush with the finished wall surface. For example, electrical codes may limit the distance the front face of an electrical box can be recessed from the finished surface of a wall to no more than one-quarter of an inch. To meet these requirements, electrical boxes may be required to be installed in different configurations depending on the thickness of a metal stud, thickness of a wall surface, and distance from the metal stud (or other mounting surface).

BRIEF DESCRIPTION OF THE DRAWINGS

FIG. 1 provides a front perspective view of an adjustable bracket assembly securing an electrical box to a metal stud according to an implementation described herein;

FIG. 7A provides a front perspective view of the adjustable bracket assembly of FIG. 1 configured for installing the electrical box with double drywall;

FIG. 8 is a top perspective view of the adjustable bracket assembly of FIG. 1 securing an electrical box to a metal stud for a double five-eighth-inch drywall installation;

DETAILED DESCRIPTION OF PREFERRED EMBODIMENTS

The following detailed description refers to the accompanying drawings. The same reference numbers in different drawings may identify the same or similar elements.

According to an implementation described herein a bracket assembly is provided for mounting an electrical box. The bracket assembly provides a rigid mounting structure that may be selectively adjusted (e.g., by a user) to be mounted on one of multiple-sized studs, such as a smaller standard-size stud (e.g., a two and one-half inch depth metal stud) or one or more larger standard-size studs (e.g., a three and five-eighth inch depth metal stud, or a six inch depth metal stud). In some implementations, the bracket assembly may also provide for multiple preconfigured mounting depths between the stud and an open face of the electrical box. The preconfigured mounting depths may include, for example, depths for single drywall surfaces and double-drywall surfaces, with or without resilient bar installations.

In descriptions herein, the terms "front" or "forward" may generally refer to a direction from a room's exterior toward a room's interior, and the terms "back," "rear," or "rearward" may generally refer to a direction from a room's interior toward a room's exterior.

Figure 2A:
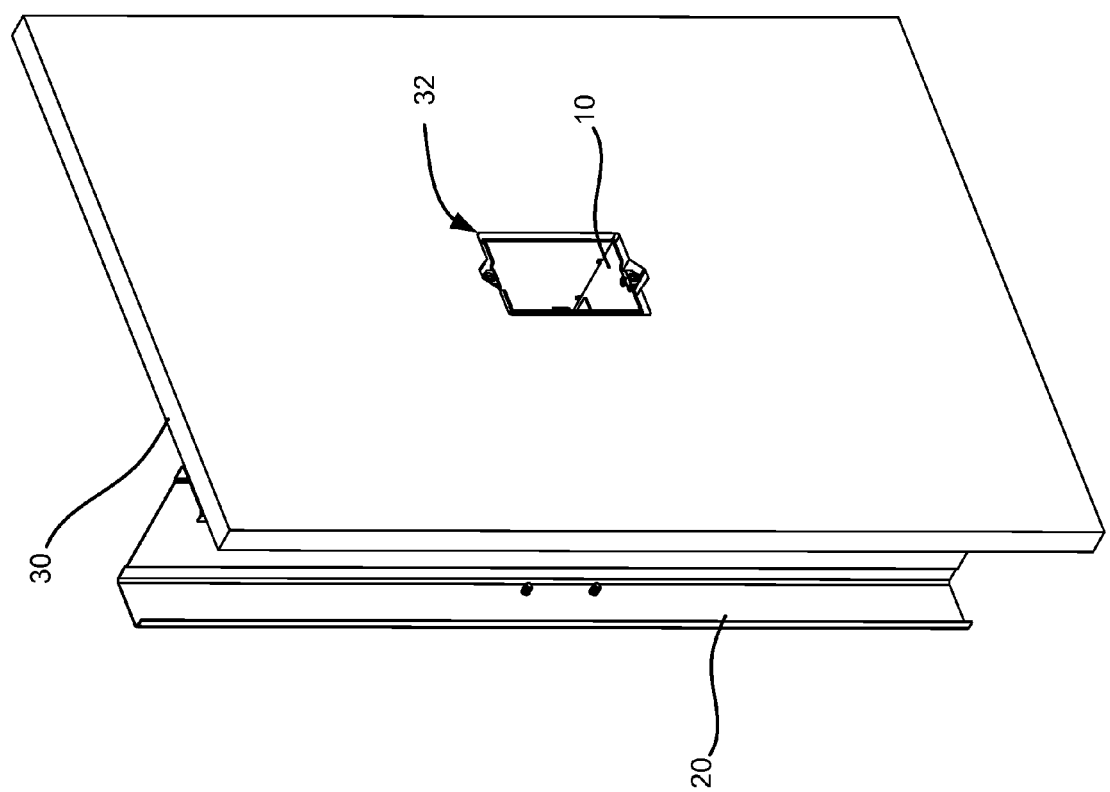
FIGS. 2A and 2B provide a front and rear perspective view, respectively, of the assembly of FIG. 1 installed against a wall surface.
Figure 2B:
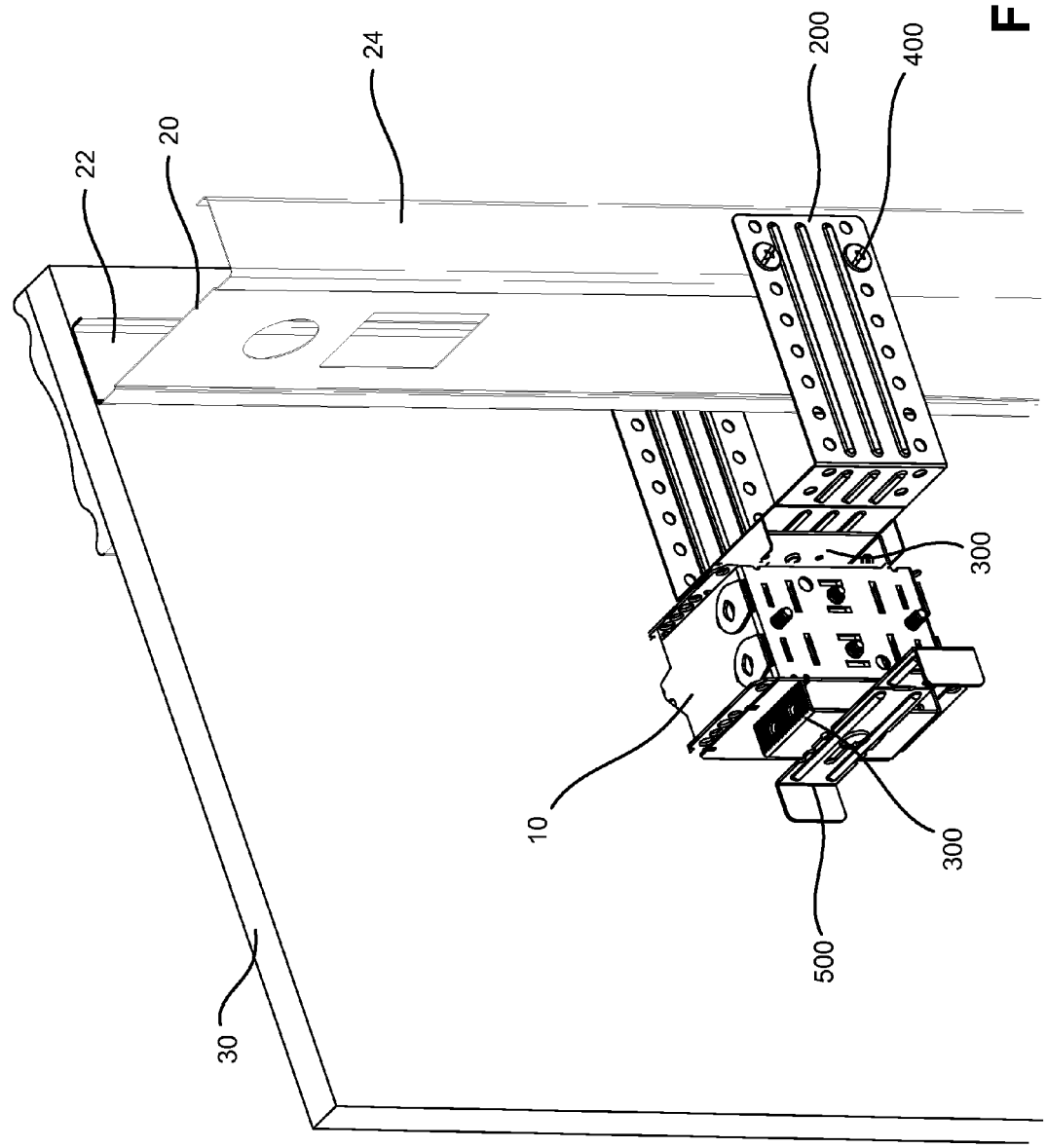

FIG. 1 provides a front perspective view of an adjustable bracket assembly 100 securing an electrical box 10 to a metal stud 20 according to an implementation described herein. FIGS. 2A and 2B provide a front and rear perspective view, respectively, of adjustable bracket assembly 100 installed against a wall surface 30. Referring collectively to FIGS. 1-2B, adjustable bracket assembly 100 may be used to secure electrical box 10 to stud 20 and position electrical box 10 against wall surface 30 in a desired location so that a face of electrical box 10 is accessible through a hole 32 in wall surface 30.

Adjustable bracket assembly 100 may include a primary bracket 200 and one or more welded (or "secondary") brackets 300 adjustably secured by removable fasteners 400. In one implementation, a support bracket 500 may be secured to a second welded bracket 300 to provide support on the side of electrical box 10 that is opposite the side connected to adjustable bracket assembly 100. Adjustable bracket assembly 100 may provide an adjustable configuration for being attached to studs 20 of different thickness (e.g., generally in the direction of the z-axis of FIG. 1). Adjustable bracket assembly 100 may enable correct positioning of electrical box 10 in wall frames with or without a resilient bar. (A resilient bar is generally a metal channel designed to improve the sound insulation of drywall installations by isolating the drywall from the studs.)

Figure 3:
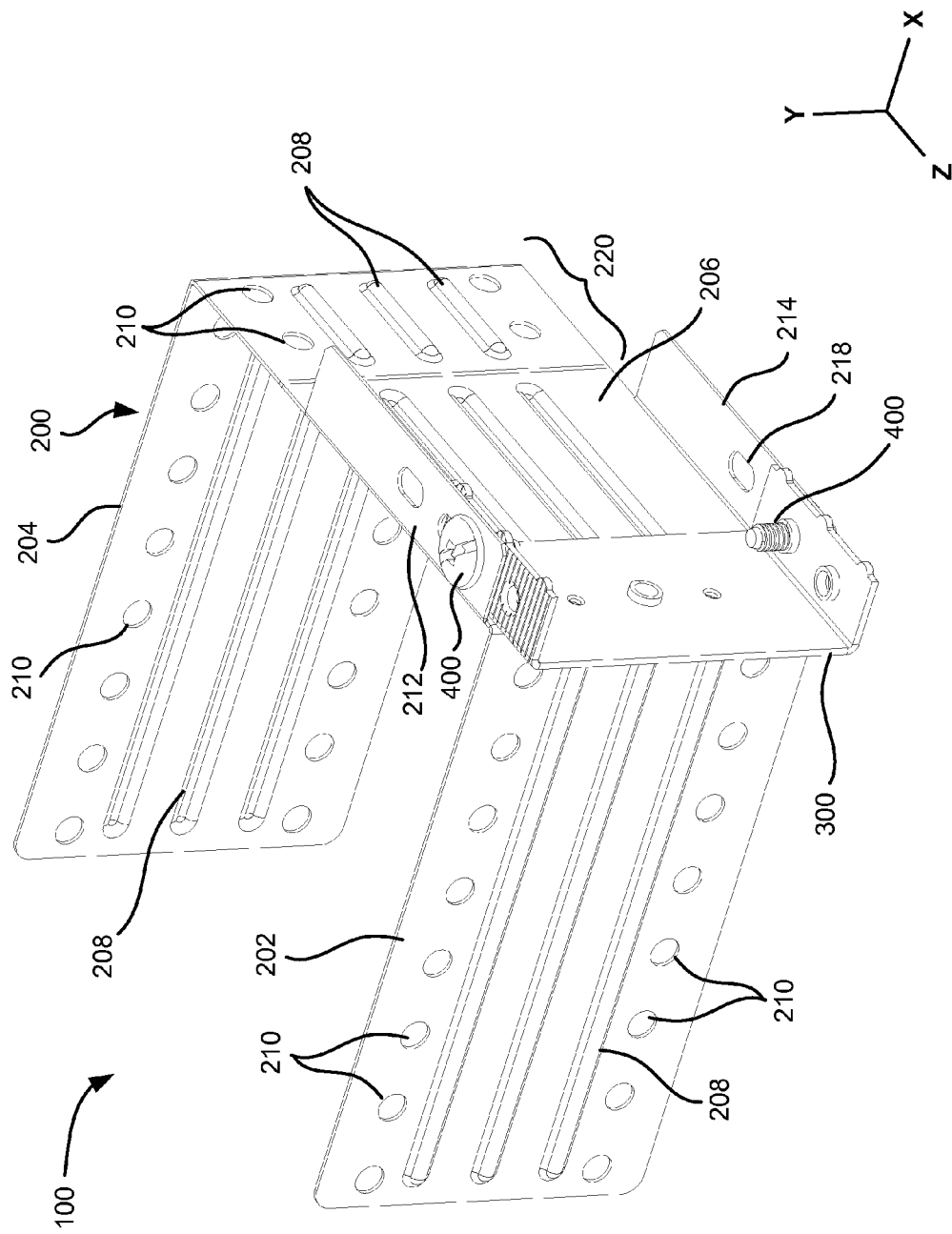
FIG. 3 provides a perspective view of the bracket assembly of FIG. 1.

FIG. 3 provides a perspective view of bracket assembly 100. As shown in FIG. 3, primary bracket 200 may include a front panel (also referred to as a "first end panel") 202, a rear panel (also referred to as a "second end panel") 204, a mounting panel 206, and an adaptation panel 220. Each of front panel 202, rear panel 204, mounting panel 206, and adaptation panel 220 may include a set of ribs 208 to improve stiffness of primary bracket 200. Ribs 208 may generally include indentations extending along a length of panels 202, 204, 206, and 220 (e.g., along an x-axis for panels 202/204 and along a z-axis for mounting panel 206). Although three ribs 208 are shown in each of panels 202, 204, 206, and 220, in other implementations, more or fewer ribs 208 may be included.

Panels 202, 204, and 220 may also include multiple mounting holes 210 to enable primary bracket 200 to be secured to a mounting surface (e.g., stud 20). For example, fasteners 400 may be inserted through mounting holes 210 to secure front panel 202 and rear panel 204 to opposite sides 22 and 24 (FIG. 2B) of stud 20. In one implementation, ribs 208 on front panel 202, rear panel 204, and adaptation panel 220 are configured to protrude away from the mounting surface to permit front panel 202, rear panel 204, and/or adaptation panel 220 to fit flush against the mounting surface. Particular sets of mounting holes 210 may be selected by a user to position mounting panel 206 at a desired distance (e.g., along the x-axis) from stud 20. Although a particular pattern of holes 210 is shown for primary bracket 200, in other implementations, holes 210 may be of different sizes and/or arranged in different patterns.

Mounting panel 206 may include an upper flange 212 and a lower flange 214 onto which one of welded brackets 300 may be fastened. Flanges 212/214 may extend laterally from a top edge and a bottom edge of mounting panel 206, respectively. Each of flanges 212/214 may include forward slots 216 and rearward slots 218 (FIG. 4) that may receive a fastener 400 and allow for adjustment of a forward position (e.g., along the z-axis) of welded brackets 300 relative to primary bracket 200. Flanges 212/214 may generally extend the length (e.g., along the z-axis) of mounting panel 206, which may correspond to, for example, a standard stud depth (e.g., a nominal two and one-half inch stud depth).

Figure 4:
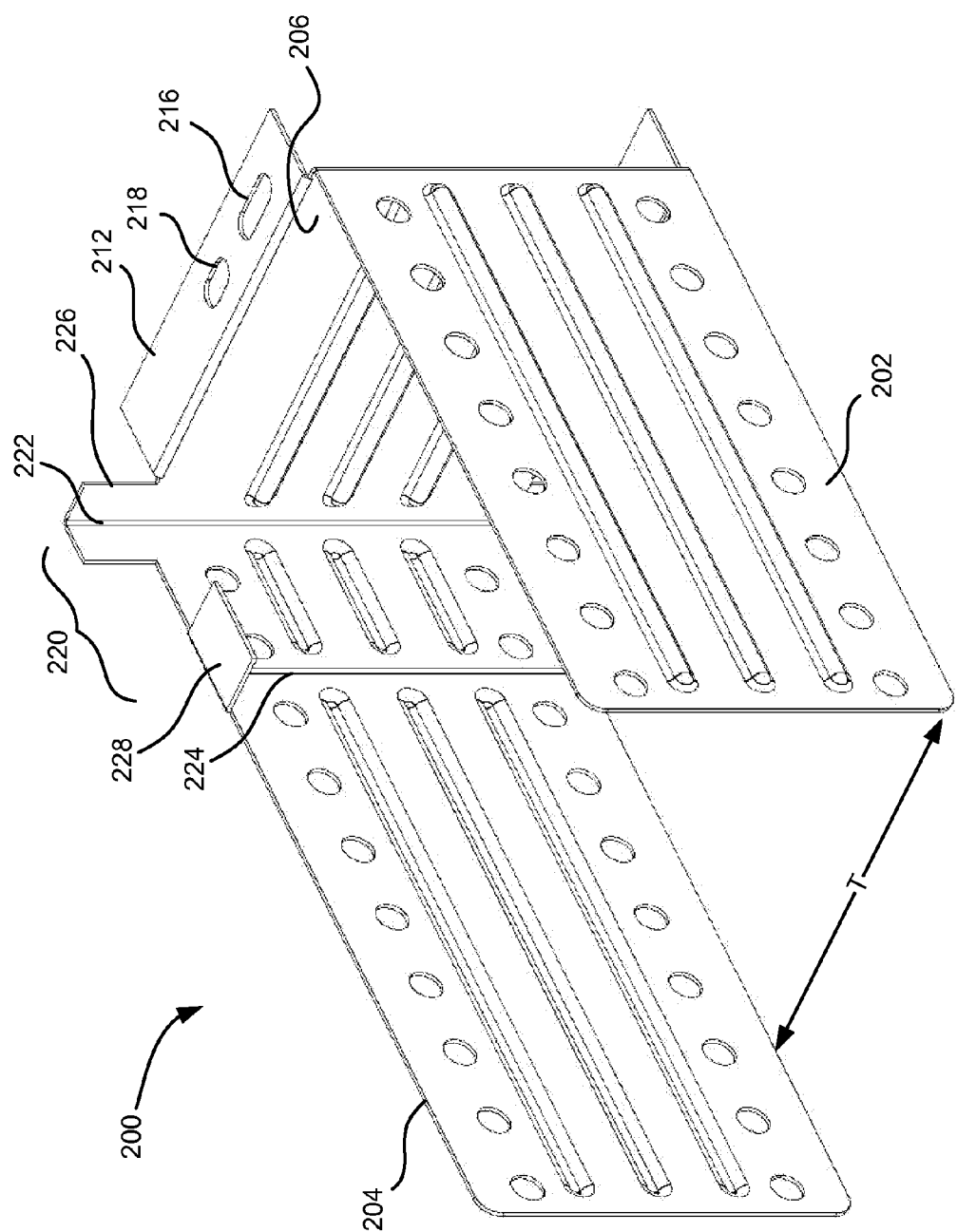
FIG. 4 provides a perspective view of a primary bracket, of the bracket assembly of FIG. 1, folded for a smaller thickness stud.
Figure 5:
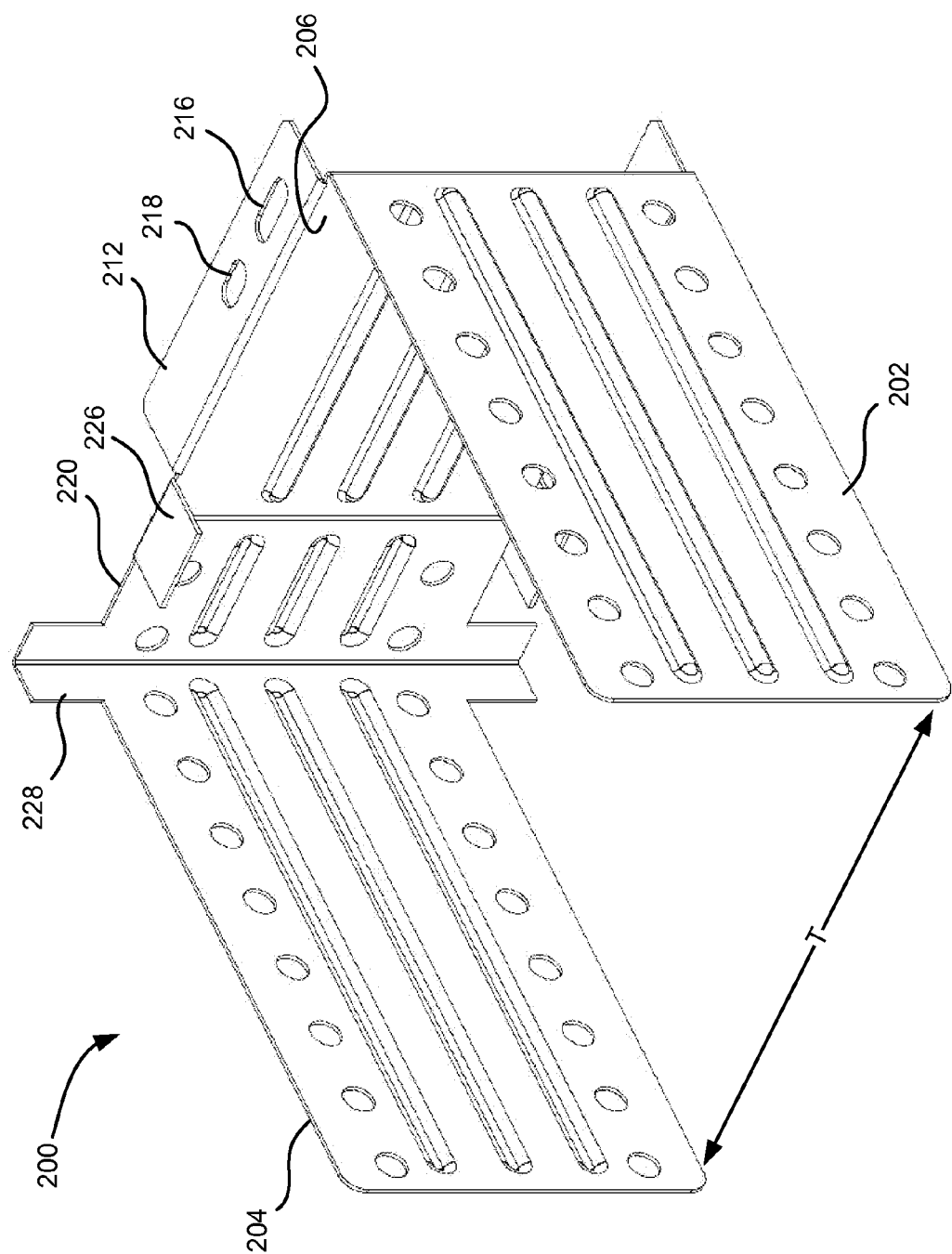
FIG. 5 provides a perspective view of the primary bracket, of the bracket assembly of FIG. 1, folded for a larger thickness stud.

FIG. 4 provides a perspective view of primary bracket 200 folded for installation on a smaller thickness stud (e.g., a nominal two and one-half inch depth stud). FIG. 5 provides a perspective view of primary bracket 200 folded for installation on a larger thickness stud (e.g., a nominal three and five-eighth inch depth stud). Primary bracket 200 may be made from a metal material that can be bent/formed, such as, for example, galvanized 25-gauge steel.

Referring to FIGS. 4 and 5, adaptation panel 220 may allow a user to modify the distance, T, between front panel 202 and rear panel 204. In one implementation, adaptation panel 220 may be framed by score lines 222 and 224. Score lines 222 and 224 may define bending points to selectively change the shape of primary bracket 200. Ribs 208 may be discontinued in the areas of score lines 222 and 224 to better facilitate bending. Also, flanges 212/214 do not extend into adaptation panel 220. Thus, in the configuration of FIG. 4, primary bracket 200 may be selectively configured to a first thickness (e.g., for a two and one-half inch stud) by bending primary bracket 200 to a ninety-degree angle at score line 222 while keeping primary bracket 200 unbent at score line 224. Conversely, in the configuration of FIG. 5, primary bracket 200 may be selectively configured to a second thickness (e.g., a three and five-eighths inch stud) by bending primary bracket 200 to a ninety-degree angle at score line 224 while keeping primary bracket 200 unbent at score line 222. In other implementations, primary bracket 200 may be configured with additional score lines or differently-spaced score lines to define additional adaptation sections (e.g., to accommodate other standard stud depths).

In one implementation, a set of tabs 226 may be provided at a top and bottom edge of mounting panel 206 adjacent score line 222. Another set of tabs 228 may be provided at a top and bottom edge of rear panel 204/mounting panel 206 adjacent score line 224. Tabs 228 may be selectively folded over to prevent bending along score line 224 (e.g., when primary bracket 200 is configured to the smaller thickness), as shown in FIG. 4. Tabs 226 may be selectively folded over to prevent bending along score line 222 (e.g., when primary bracket 200 is configured to a different thickness), as shown in FIG. 5. Tabs 226/228 may further enhance the rigidity of adjustable bracket assembly 100 in locations where there is a discontinuity of ribs 208.

Figure 6:
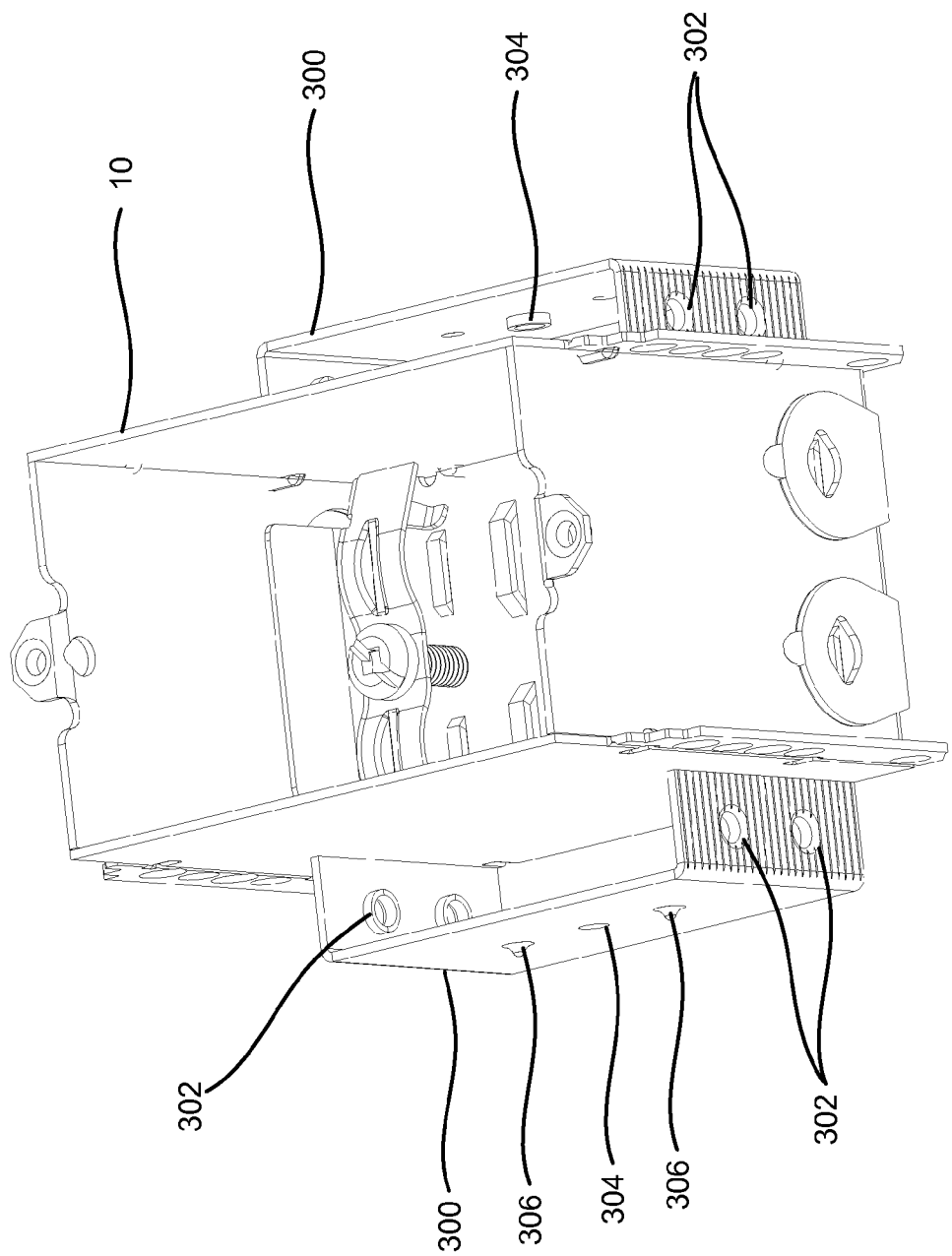
FIG. 6 provides perspective view of an electrical box with welded brackets.

FIG. 6 provides perspective view of electrical box 10 with welded brackets 300. As shown in FIG. 6, welded brackets 300 may be welded to opposite sides of electrical box 10 to provide an attachment point for primary bracket 200 on either side of electrical box 10. Welded brackets 300 may also provide an attachment point for support bracket 500 on an opposite side from the attached primary bracket 200. Welded brackets 300 may be made from the same or different material than that of primary bracket 200. For example, welded bracket 300 may be formed from a smaller gauge (e.g., thicker) galvanized steel material than bracket 200. According to an implementation described herein, in a production environment, electrical boxes 10 may be manufactured and supplied with welded brackets 300 installed. While electrical box 10 is shown as a single-gang box in FIG. 6, in other implementations, electrical box 10 may be a different type of electrical box, such as a double-gang box, a triple-gang box, a quadruple gang box, an octagonal box, a square box, etc. Welded brackets 300 may be welded or otherwise secured to electrical box 10.

Welded brackets 300 may include holes 302 configured to align with slots 216/218 of flanges 212/214 on primary bracket 200. In one implementation, holes 302 may be of a particular diameter to receive a threaded fastener 400 and allow threaded fastener 400 to be tightened to prevent relative movement between flange 200 and welded bracket 300. The location of welded brackets 300 on electrical box 10 may be consistently placed to permit alignment with primary bracket 200 for a variety of standard depth configurations of wall surface 30 relative to stud 20 (e.g., single drywall, double drywall, single drywall with resilient bar, double drywall with resilient bar, etc.).

In one implementation, forward slots 216 of flanges 212/214 may generally be applicable for alignment in double drywall installations (e.g., with or without a resilient bar), and the rearward slots 218 may be generally applicable for alignment of single drywall installations (e.g., with or without a resilient bar). For example, as shown in FIG. 1, particular holes 302 and slots may be aligned to provide a particular depth, $D_1$, between front panel 202 and the face of electrical box 10. The forward-most holes 302 of welded brackets 300 may be aligned with the rearward-most slots 218 of flanges 212/214. Depth $D_1$ may correspond, for example to an installation depth when wall surface 30 is a single piece of drywall.

Welded brackets 300 may also include a mounting hole 304 and protrusions 306. As described further herein, mounting hole 304 may be used to mount support bracket 500 to welded bracket 300. Also as described further herein, protrusions 306 may provide separate functions when mounting welded bracket 300 to either primary bracket 200 or support bracket 500.

FIG. 7A provides a front perspective view of the adjustable bracket assembly 100 configured for installing electrical box 10 with double drywall. As shown in FIG. 7A, the forward-most holes 302 (FIG. 6) of welded brackets 300 may be aligned with the forward slots 216 of flanges 212/214 to provide a depth, $D_2$, between front panel 202 and the face 12 of electrical box 10. Depth $D_2$ may correspond, for example to an installation depth when wall surface 30 includes two overlapping pieces of drywall.

Figure 7B:
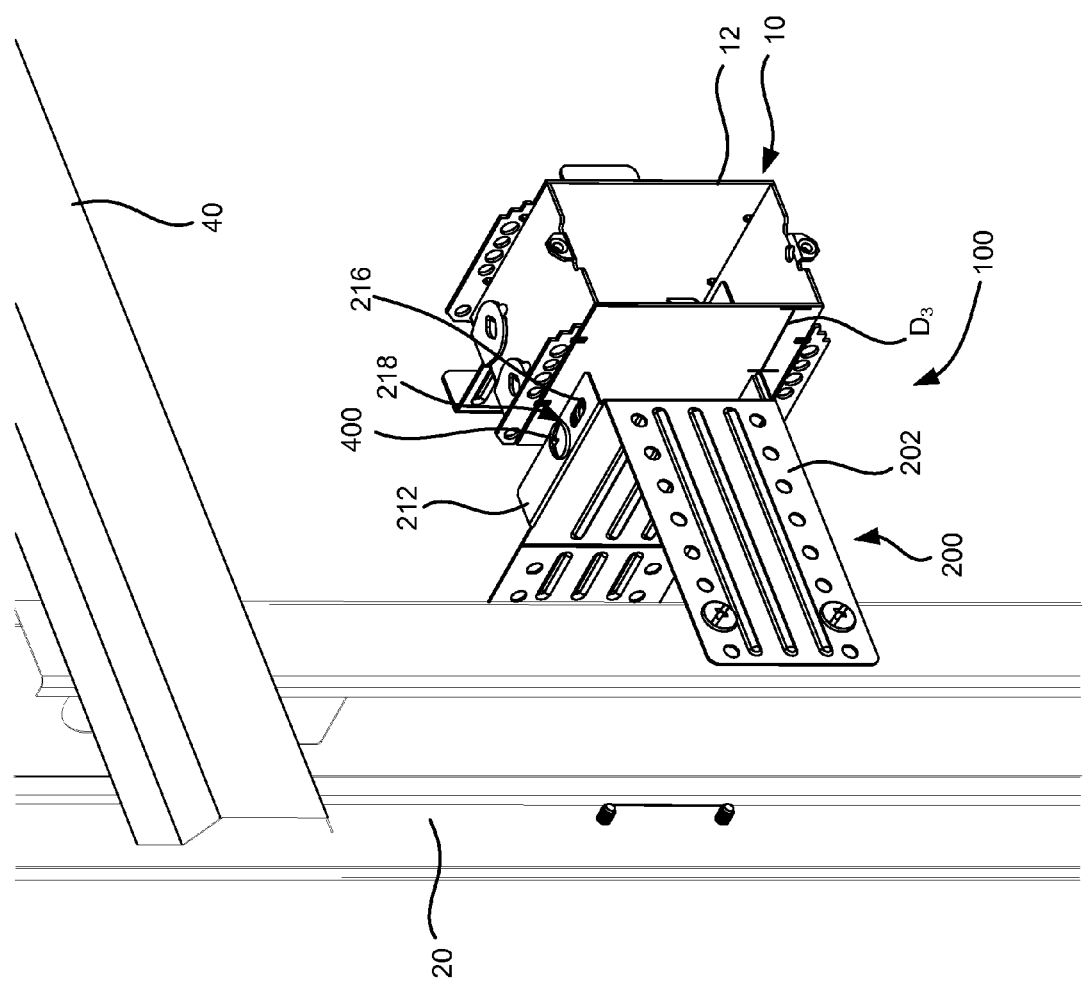
FIG. 7B provides a front perspective view of the adjustable bracket assembly of FIG. 1 configured for installing the electrical box with single drywall and a resilient bar.

FIG. 7B provides a front perspective view of the adjustable bracket assembly 100 configured for installing electrical box 10 with single drywall and a resilient bar 40. As shown in FIG. 7B, the rearward-most holes 302 of welded brackets 300 may be aligned with rearward slots 218 of flanges 212/214 to provide a depth, $D_3$, between front panel 202 and the face 12 of electrical box 10. Depth $D_3$ may correspond, for example to an installation depth when wall surface 30 is a single piece of drywall mounted to resilient bar 40.

Figure 7C:
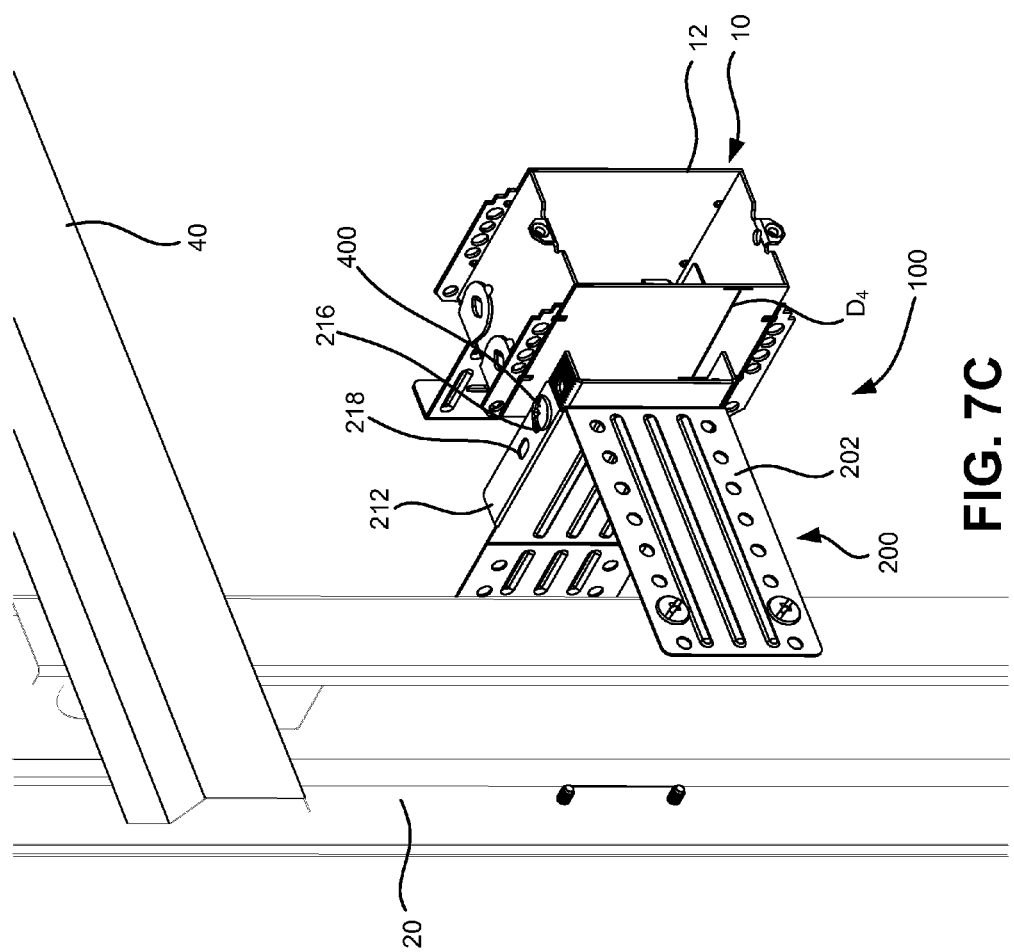
FIG. 7C provides a front perspective view of the adjustable bracket assembly of FIG. 1 configured for installing the electrical box with double drywall and a resilient bar.

FIG. 7C provides a front perspective view of the adjustable bracket assembly 100 configured for installing electrical box 10 with double drywall and a resilient bar 40. As shown in FIG. 7B, the rearward-most holes 302 of welded brackets 300 may be aligned with the forward slots 216 of flanges 212/214 to provide a depth, $D_4$, between front panel 202 and the face 12 of electrical box 10. Depth $D_4$ may correspond, for example to an installation depth when wall surface 30 includes two overlapping pieces of drywall mounted to resilient bar 40.

Figure 9:
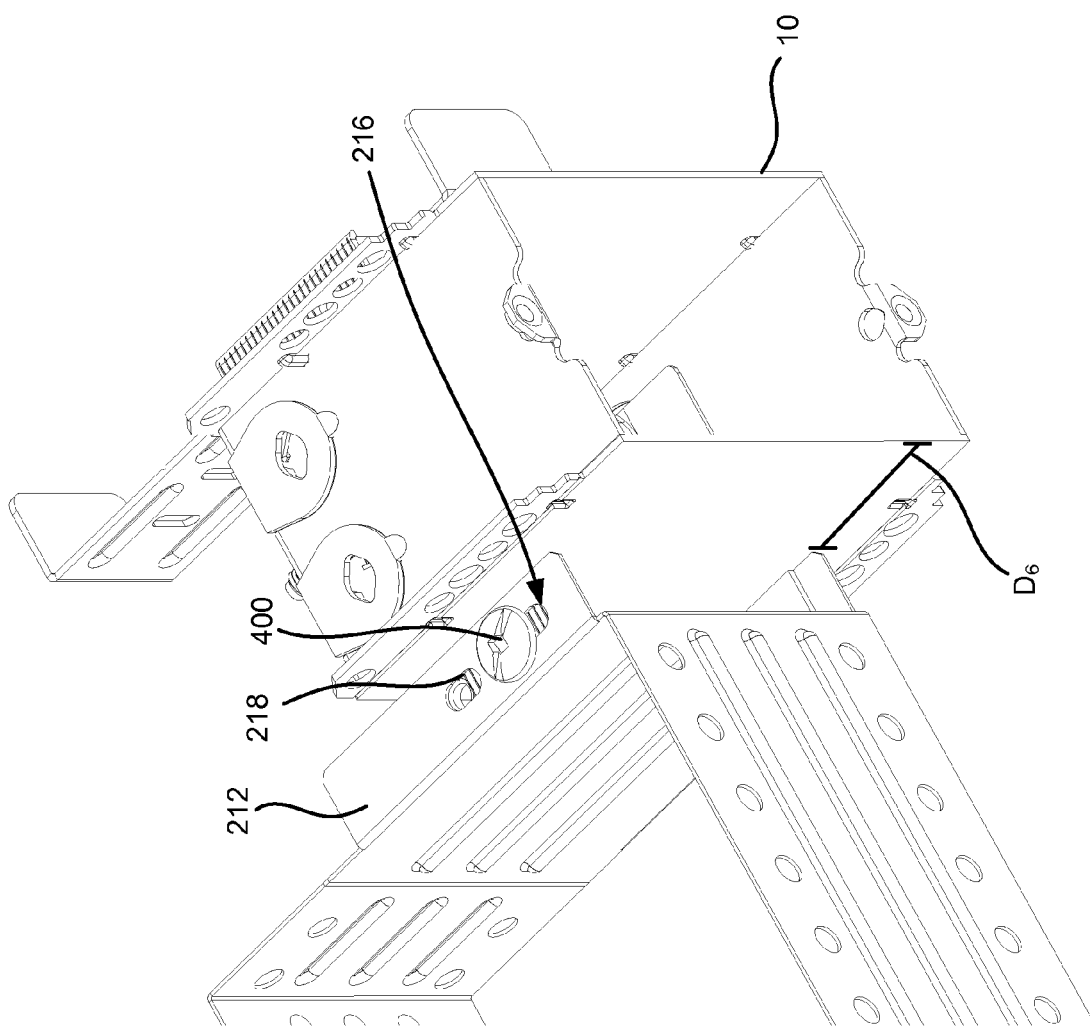
FIG. 9 is a top perspective view of the adjustable bracket assembly of FIG. 1 securing an electrical box to a metal stud for a double half-inch drywall installation.

FIG. 8 provides a top perspective view of adjustable bracket assembly 100 securing electrical box 10 to metal stud 20 for a five-eighth inch double drywall installation (e.g., without a resilient bar). FIG. 9 provides a top perspective view of the adjustable bracket assembly 100 securing electrical box 10 to metal stud 20 for a one-half inch double drywall installation (e.g., without a resilient bar). In addition to the different depths that may be configured using different alignment of slots 216/218 and holes 302, smaller depth variations may be provided by the depth (e.g., along the z-axis) of slots 216/218. For example each of slots 216/218 may be configured with a front end corresponding to a first standard drywall thickness (e.g., one-half inch) and a back end corresponding to a second standard drywall thickness (e.g., five-eighths inch). Furthermore, the depth of the forward slots 216 may be different (e.g., larger) than the depth of the rearward slots 218. The larger depth of the forward slots 216 would account for larger variances between a double drywall installation (e.g., up to one-quarter inch) than a those of a single drywall installation (e.g., one-eighth inch).

As shown in FIG. 8, fasteners 400 in the front holes 302 of welded bracket 300 are aligned with the front of forward slot 216 to provide additional depth, $D_5$, for two overlapping drywall pieces of five-eighths inch each. As shown in FIG. 9, fasteners 400 in the front holes 302 of welded bracket 300 are aligned with the back of forward slot 216 to provide a depth, $D_6$, for two overlapping drywall pieces of one-half inch each. Adjustments for single-drywall installations may be made in similar fashion using rearward slots 216.

Figure 10:
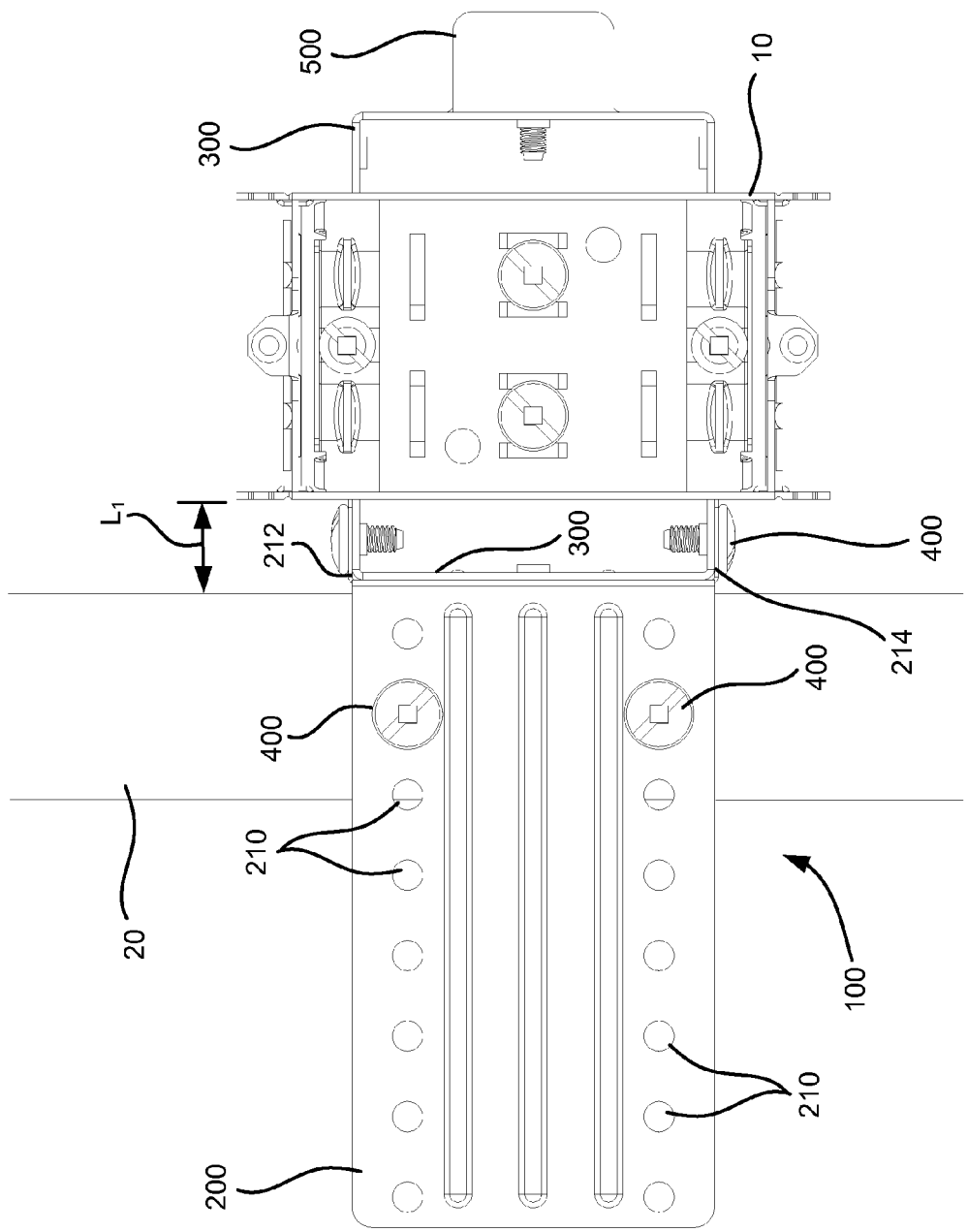
FIG. 10 provides a front view of the adjustable bracket assembly of FIG. 1 securing the electrical box near to a metal stud.
Figure 11:
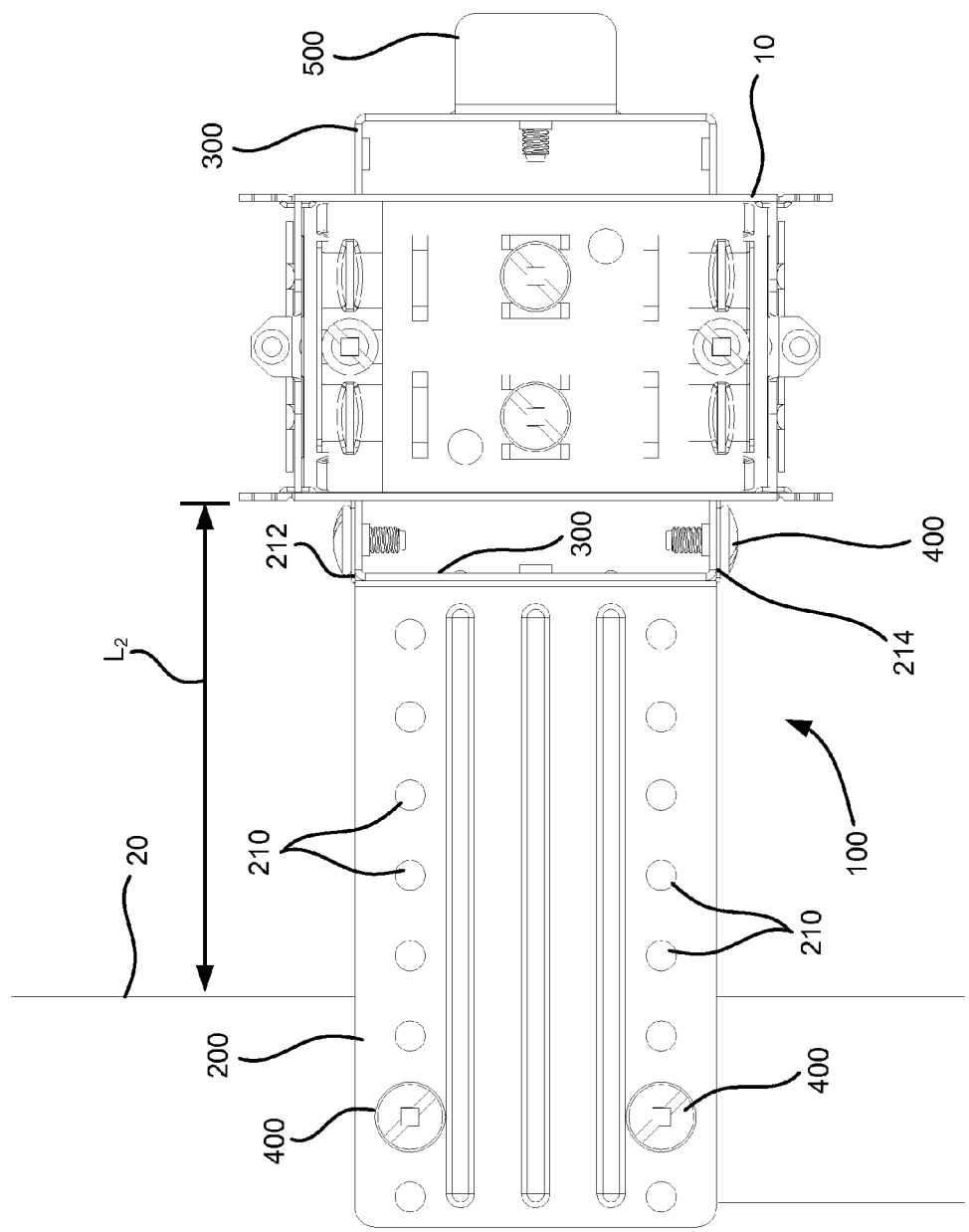
FIG. 11 provides a front view of the adjustable bracket assembly of FIG. 1 securing the electrical box far from a metal stud.

FIGS. 10 and 11 provide front views of adjustable bracket assembly 100 securing an electrical box 10 to a metal stud 20. More particularly, FIG. 10 provides a front view of adjustable bracket assembly 100 securing electrical box 10 at a close distance, $L_1$, to metal stud 20, and FIG. 11 provides a front view of adjustable bracket assembly 100 securing the electrical box far distance, $L_2$, from metal stud 20. The distance from stud 20 may be selected at the time of installation, and primary bracket 200 may be secured to stud 20 using fasteners 400 and particular mounting holes 210. Generally, the distance between electrical box 10 and stud 20 may vary between one-half inch and four inches. However, in other implementations, the material type, material thickness, and/or primary bracket 200 dimensions may be altered to achieve a different range of distances between electrical box 10 and stud 20.

As shown, for example, in FIGS. 10 and 11, flanges 212/214 of primary bracket 200 are attached at the top and bottom of welded bracket 300 (e.g., using fasteners 400). Location of the attachment points at the top/bottom of welded brackets 300 enables a user to adjust the installed depth (e.g., distance $D_2$ of FIG. 7A) after adjustable bracket assembly 100/electrical box 10 have been installed. For example, fasteners 400 may be loosened, and electrical box 10 may be slid forward/backward within the range of the top/bottom slots 216/218 that have fasteners 400. In another example, fasteners 400 may be removed and inserted through a different combination of holes 302 and slots 216/218 to adjust the installed depth of electrical box 10.

Figure 12:
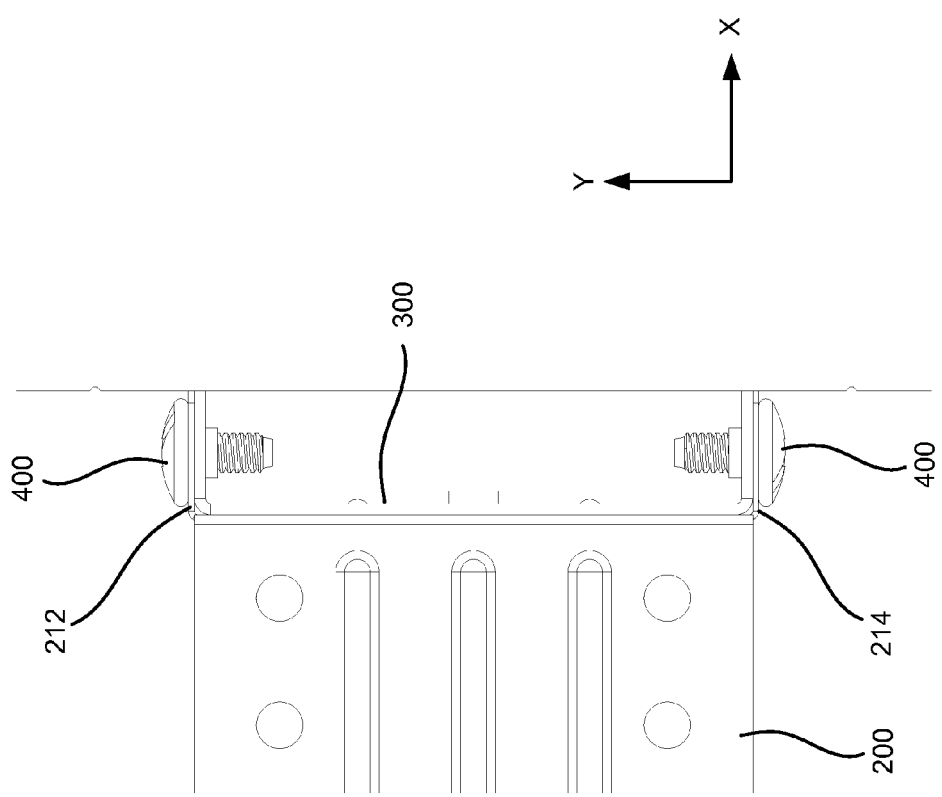
FIG. 12 provides an enlarged front view of a portion of the adjustable bracket assembly of FIG. 1.

FIG. 12 provides an enlarged front view of a portion of adjustable bracket assembly 100. As shown in FIG. 12, flanges 212/214 engage top and bottom surfaces of welded bracket 300. When fasteners 400 are loose/absent, welded bracket 300 may slide between flanges 212/214. Flanges 212/214 restrict vertical movement (e.g., along a y-axis) of welded bracket 300/electrical box 10 and provide a rigid assembly.

Figure 13:
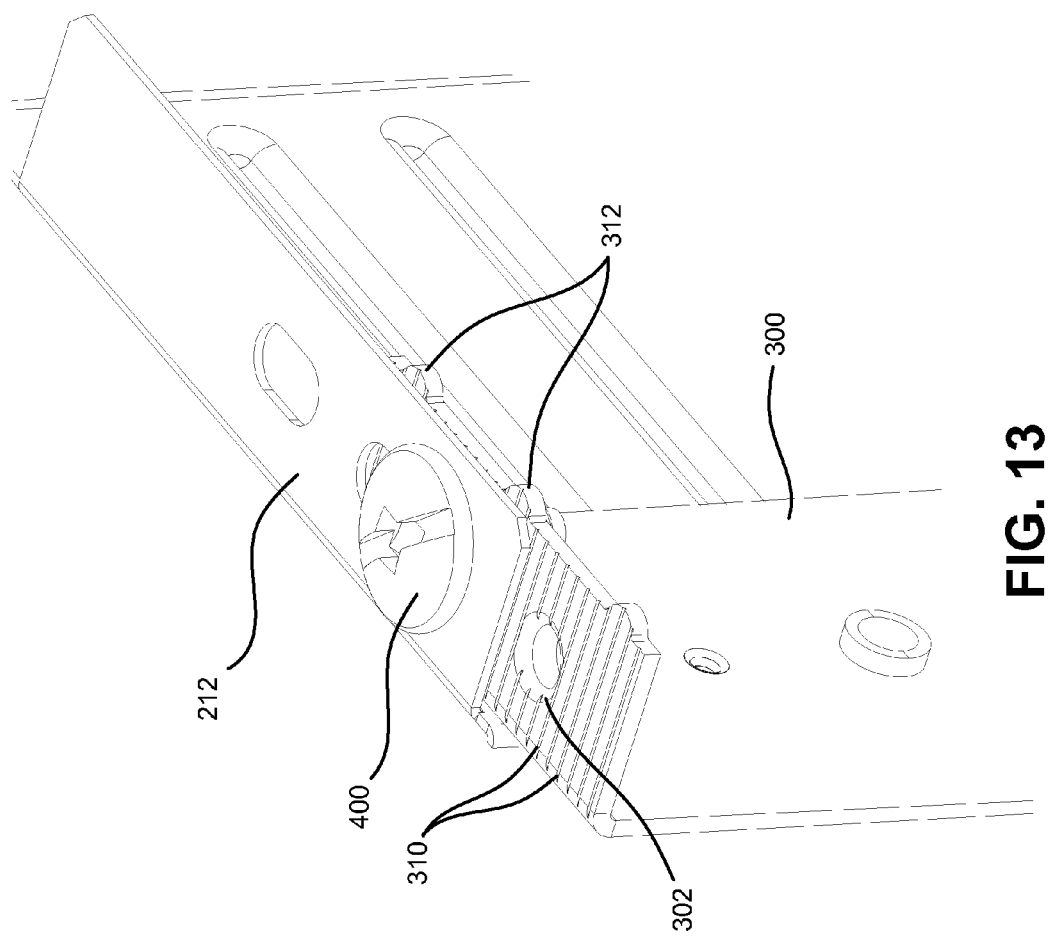
FIG. 13 provides an enlarged perspective view of an interface between a portion of the primary bracket and the welded bracket of FIG. 1.
Figure 14:
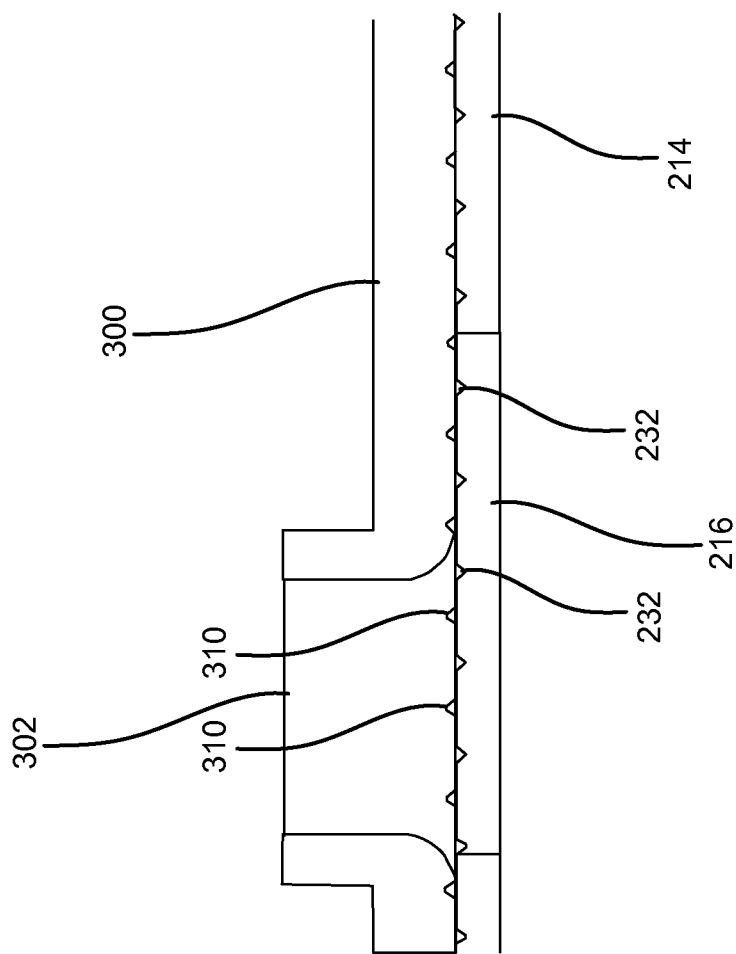
FIG. 14 provides an enlarged cross-sectional view of a portion of the interface of FIG. 13.

FIG. 13 provides an enlarged perspective view of an interface between a portion of primary bracket 200 and welded bracket 300. FIG. 14 provides an enlarged cross-sectional view of the portion of the interface of FIG. 13. Referring collectively to FIGS. 13 and 14, in one implementation, an interior surface 230 of flange 214 may include grooves 232, and an exterior surface 308 of welded bracket 300 may include grooves 310. Grooves 232 and groves 310 may both run essentially perpendicular to the sliding direction of welded bracket 300 (e.g., grooves 232 and grooves 310 may extend essentially along an x-axis). Grooves 232 and groves 310 may help to prevent slippage between primary bracket 200 and welded bracket 300 after primary bracket 200 and welded bracket 300 are secured together via fasteners 400.

Figure 15:
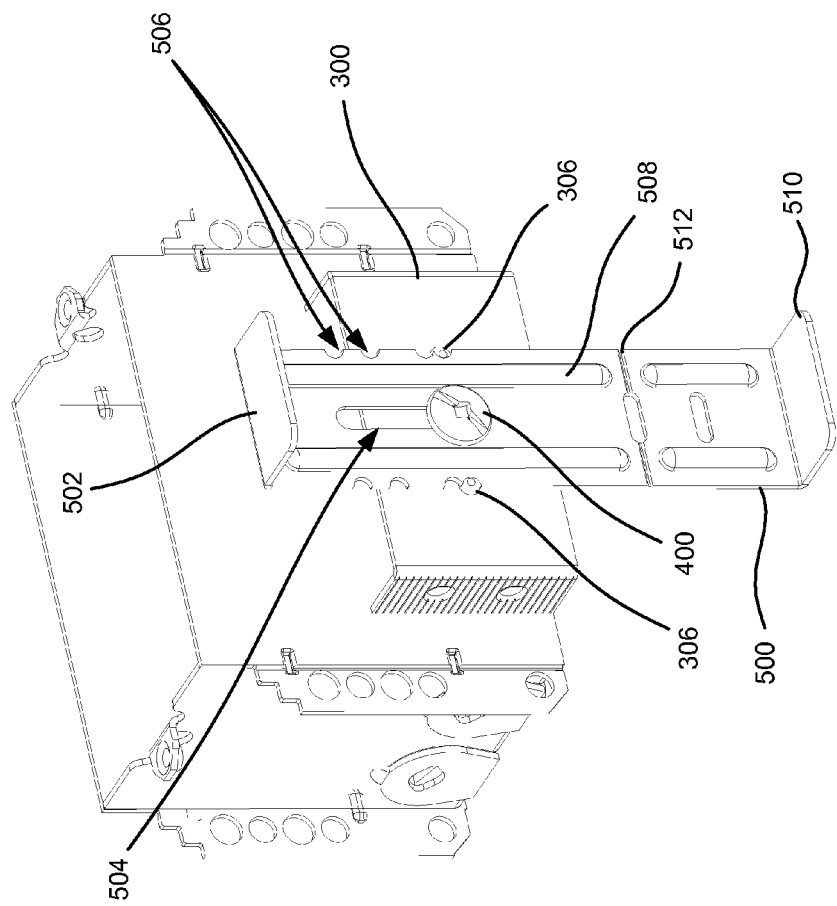
FIG. 15 provides an enlarged side perspective view of a support bracket secured to a welded bracket.

FIG. 15 provides an enlarged side perspective view of support bracket 500 secured to a welded bracket 300. As shown in FIG. 15, support bracket 500 may include a forward flange 502, a slot 504, notches 506, ribs 508, and a rear flange 510. As shown, for example, in FIGS. 6 and 15, welded bracket 300 may include mounting hole 304 and protrusions 306.

Forward flange 502 may extend laterally from an end of support bracket 500 to engage a back side of wall surface 30. Slot 504 may provide an opening through which a fastener 400 may be inserted to adjustably secure support bracket 500 to welded bracket 300. Slot 504 may generally permit forward flange 502 to engage the back side of wall surface 30 when the face of electrical box 10 is positioned in any of a variety of standard depth configurations of wall surface 30 relative to stud 20 (e.g., single drywall, single drywall with resilient bar, double drywall, double drywall with resilient bar, etc.).

Notches 506 may be located to secure support bracket 500 against protrusions 306 in a selected one of the variety of standard depth configurations. For example, a rearward-most (e.g., farthest from wall surface 30) notch 506 may correspond with a position of flange 502 against the back side of wall surface 30 when wall surface 30 is a single drywall (without a resilient bar), as shown in FIG. 15. Conversely, the forward-most notch 506 may correspond with a position of forward flange 502 against a back side of wall surface 30 when wall surface 30 is a double drywall surface without a resilient bar.

Ribs 508 may be provided to improve stiffness of support bracket 500. Ribs 508 may generally include indentations extending along a length of support bracket 500 (e.g., along a z-axis when support bracket 500 is installed on welded bracket 300 in the configuration shown in FIG. 1). Although two ribs 508 are shown on support bracket 500, in other implementations, more or fewer ribs may be included.

Rear flange 510 may extend laterally from another end (e.g., an end opposite the end with forward flange 502) of support bracket 500 to engage a back side of an opposing wall surface (e.g., to brace electrical box 10 between finished surfaces on either side 22, 24 (FIG. 2B) of stud 20). In one implementation, support bracket 500 may include a score line 512 to allow a user to bend support bracket 500 to selectively adjust the length of support bracket 500 (e.g., depending on whether bracket assembly 100 is installed to a smaller depth stud or a larger depth stud). In another implementation, support bracket 500 may include two or more score lines to accommodate multiple depths of stud 20.

Hole 304 (visible in FIG. 6 but hidden from view in FIG. 15) may be configured to align with slot 504 of support bracket 500. In one implementation, hole 304 may be of a particular diameter to receive threaded fastener 400 and allow threaded fastener 400 to be tightened to prevent relative movement between support bracket 500 and welded bracket 300.

Protrusions 306 may have multiple functions associated with either support bracket 500 or primary bracket 200, depending on the installation. Still referring to FIG. 15, protrusions 306 may be configured to receive notches 506 of support bracket 500 to align support bracket 500 in a desired standard configuration. For example, as described above, protrusions 306 may be configured to receive any set of notches 506 to position flange 502 against a back side of wall surface 30.

Figure 16:
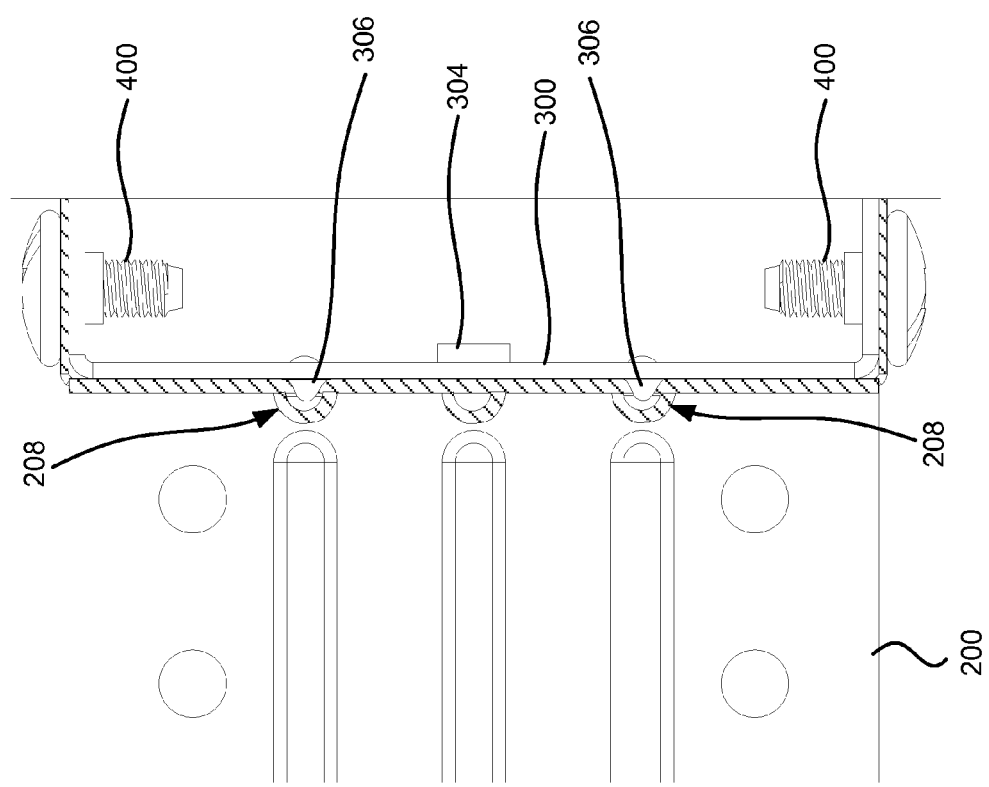
FIG. 16 provides a side view of another interface between the primary bracket and the welded bracket.

FIG. 16 provides a side view of another interface between the primary bracket and the welded bracket. Referring to FIG. 16, protrusions 306 may be configured to engage ribs 208 on mounting panel 206 of primary bracket 200. Protrusions 306 may be sized to fit within the indentation of ribs 208. Thus, protrusions 306 may provide additional support and/or alignment for primary bracket 200 in relation to welded bracket 300.

Figure 17:
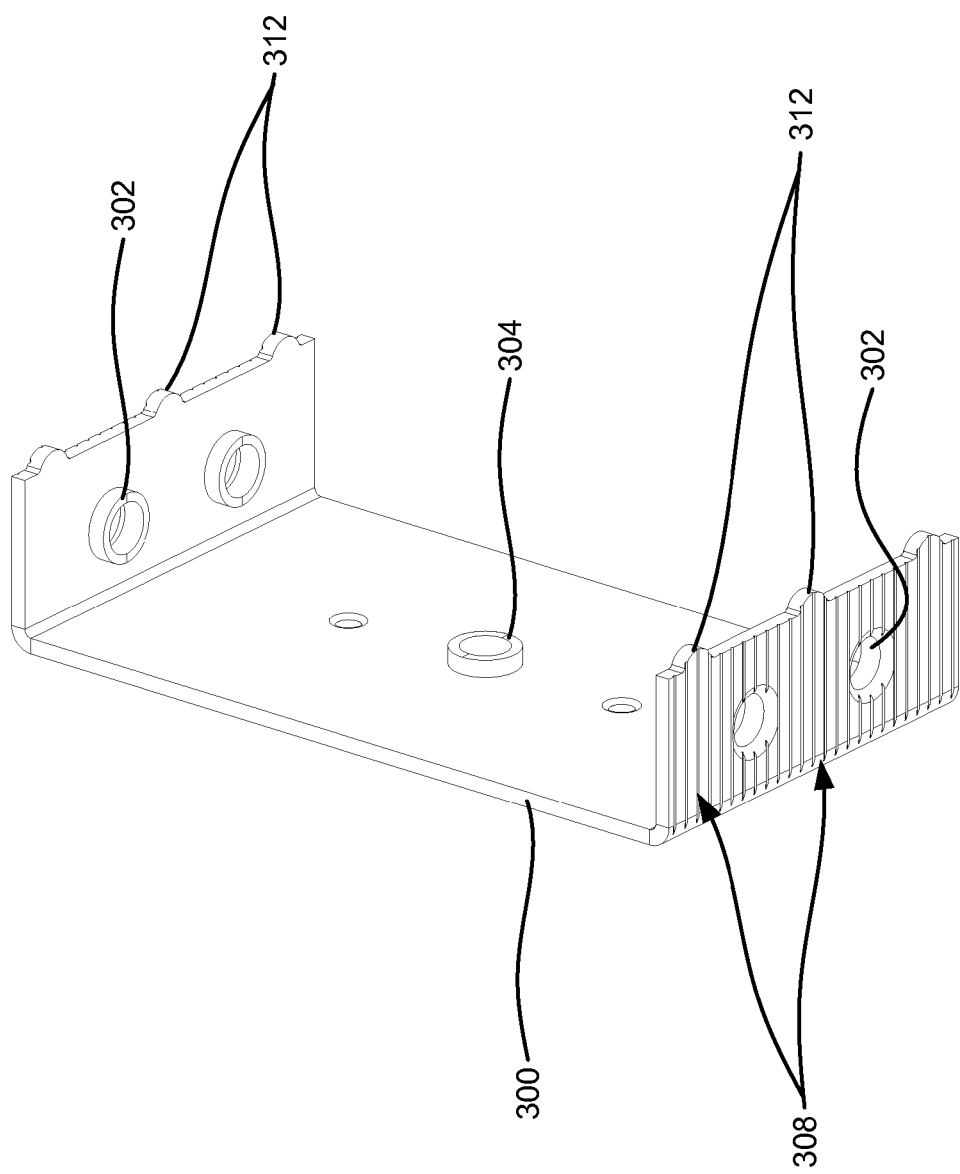
FIG. 17 provides a perspective view of the welded bracket with welding embosses according to an implementation described herein.

FIG. 17 provides a perspective view of welded bracket 300 with welding embosses 312 according to an implementation described herein. As shown in FIG. 17, welding embosses 312 are located extending from an edge of welded bracket 300 (in contrast with, for example, conventional embosses located on a flat surface). Welding embosses 312 may be melted during a welding process to secure welded bracket 300 to a side of electrical box 10. In other implementations, welded bracket 300 may be secured to electrical box 10 using different welding configurations (e.g., conventional locations for welding embosses) or different attachment mechanisms, such as flanges and screws. In another implementation, welded bracket 300 may be made integrally with electrical box 10 (e.g., in any given size electrical box).

Figure 18:
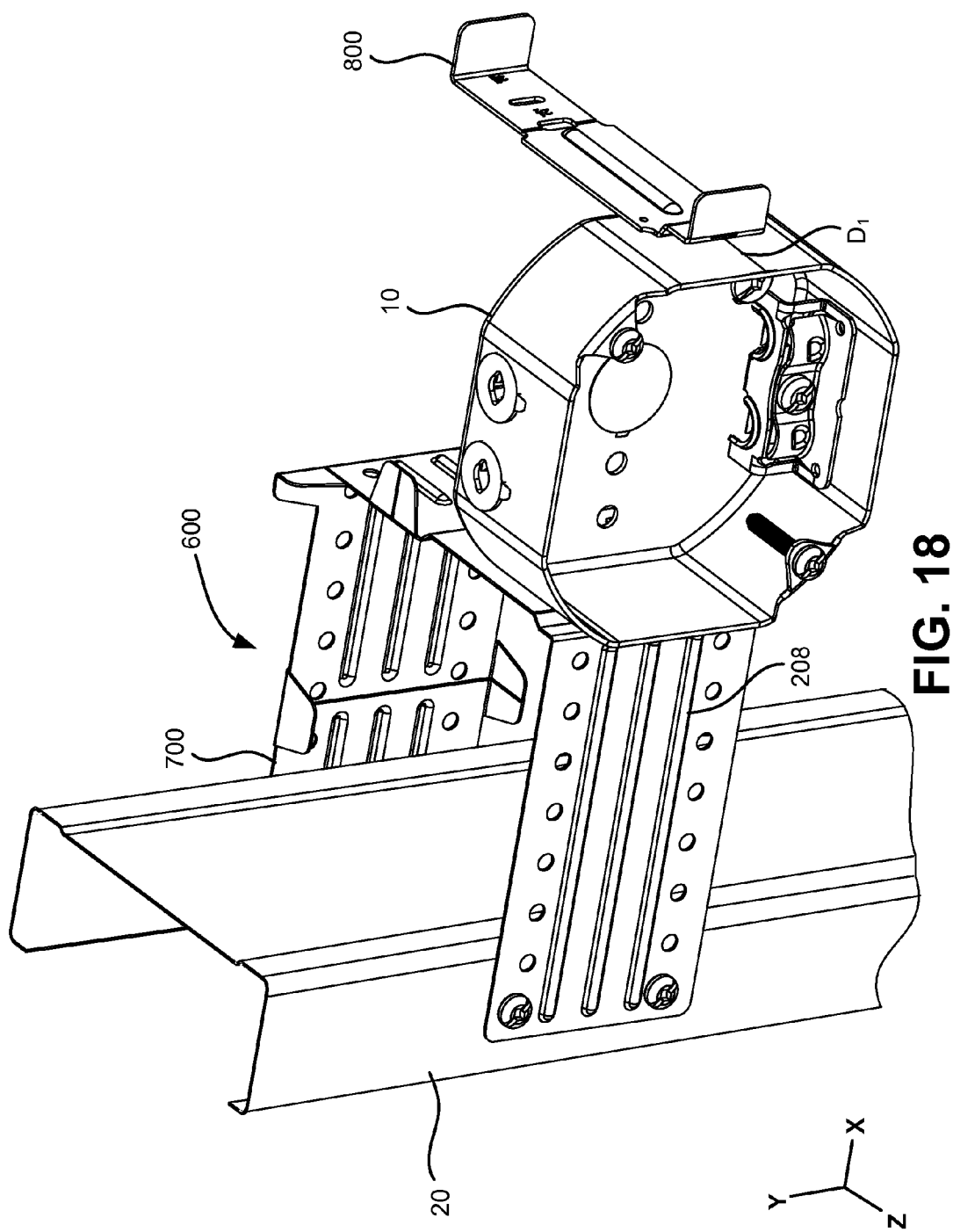
FIG. 18 provides a front perspective view of an adjustable bracket assembly securing an electrical box to a metal stud according to another implementation described herein.
Figure 19:
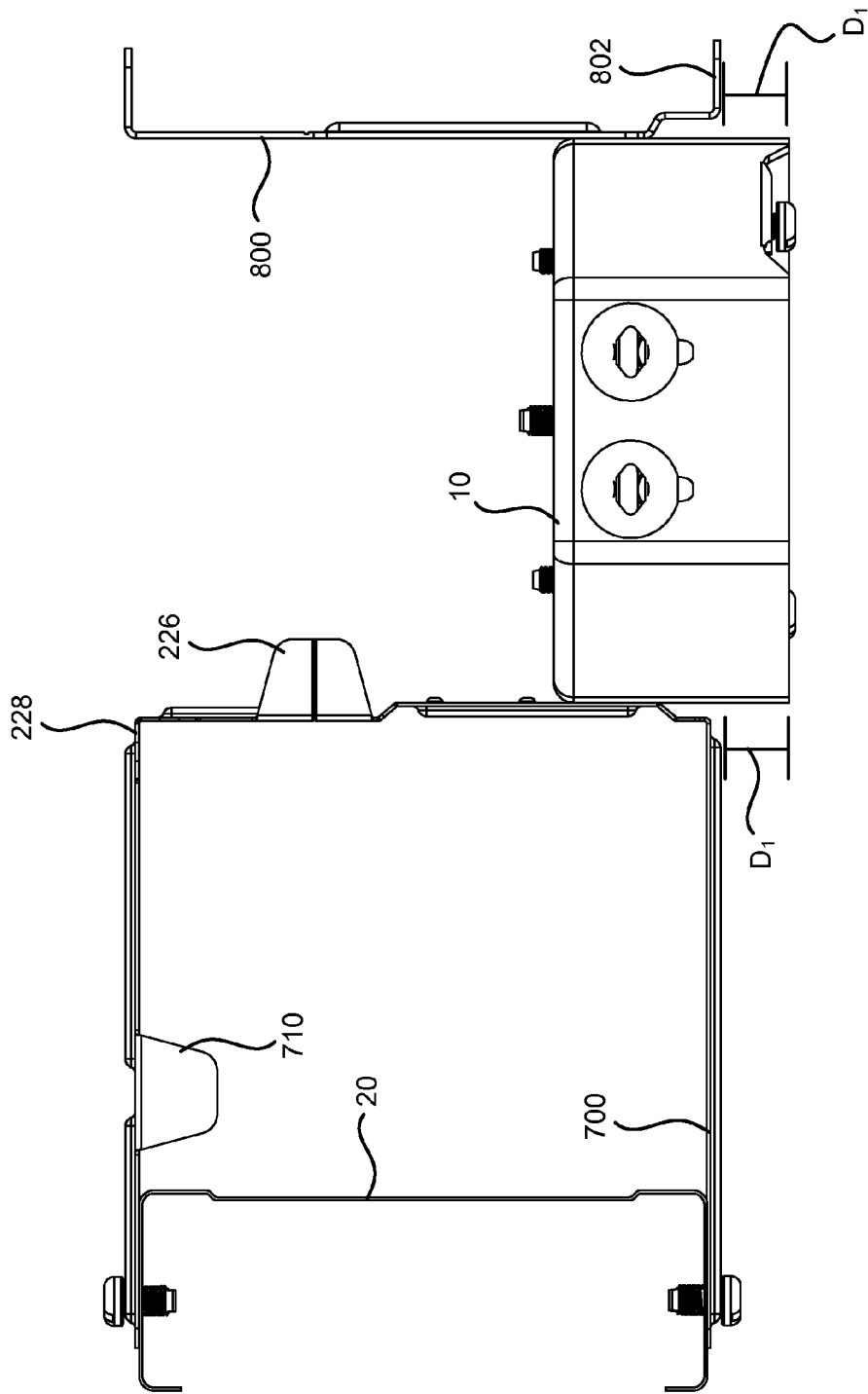
FIG. 19 provides a top view of a portion of the adjustable bracket assembly of FIG. 18.
Figure 20:
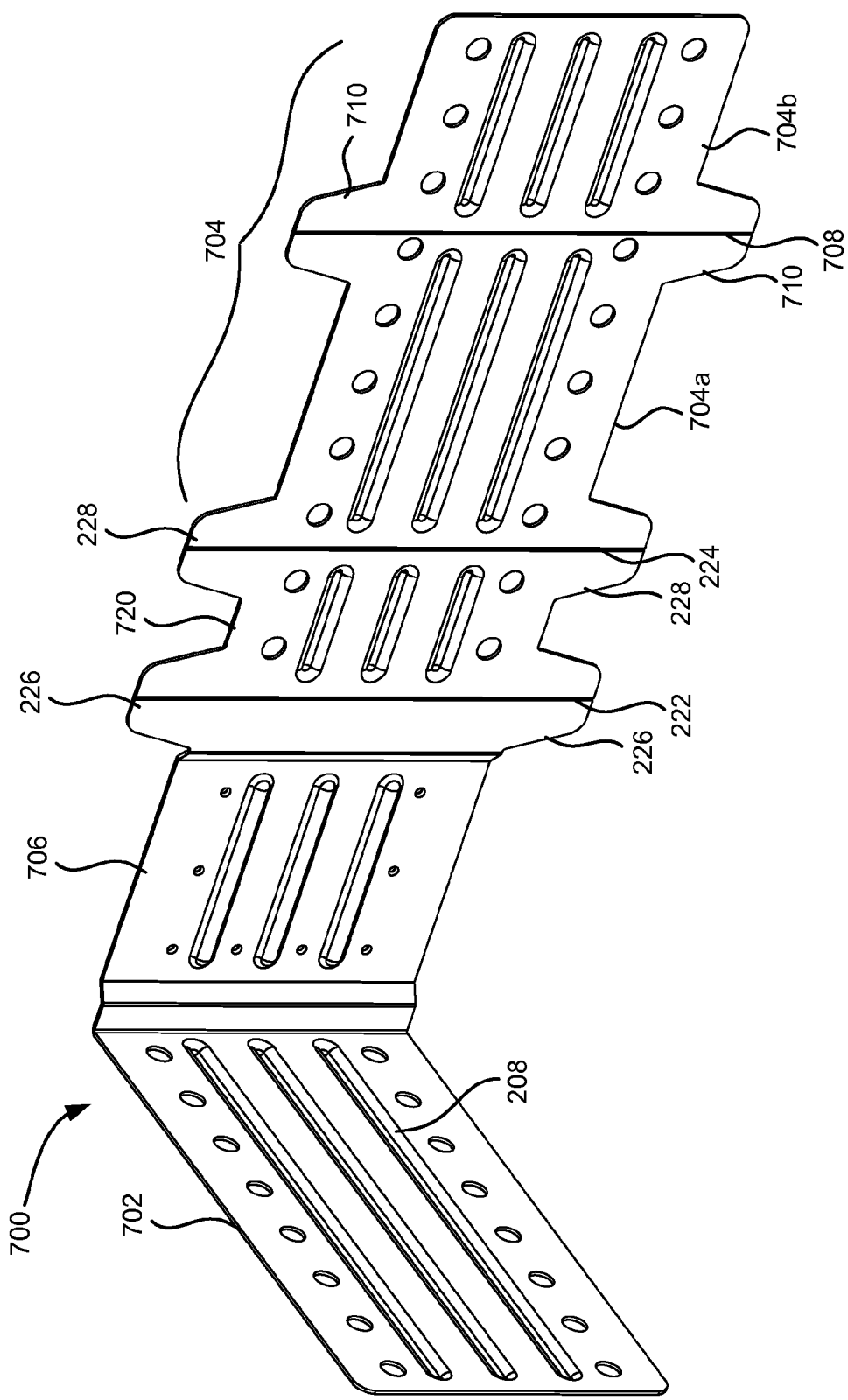
FIG. 20 provides a perspective view of a primary bracket, of the bracket assembly of FIG. 18, in an uninstalled configuration.

FIGS. 18-20 provide views of an adjustable bracket assembly 600 according to another implementation described herein. FIG. 18 provides a front perspective view of adjustable bracket assembly 600 securing electrical box 10 to metal stud 20. As shown in FIG. 18, adjustable bracket assembly 600 may include a primary bracket 700 secured directly to a side of electrical box 10. In one implementation, a support bracket 800 may be secured to an opposite side of electrical box 10. Primary bracket 700 and support bracket 800 may be secured, for example, using welding, bonding, mechanical fasteners, etc. Similar to adjustable bracket assembly 100, adjustable bracket assembly 600 may provide an adjustable configuration for being attached to studs 20 of different thickness (e.g., generally in the direction of the z-axis of FIG. 18). Adjustable bracket assembly 600 may enable correct positioning of electrical box 10 in drywall installations of a particular standard thickness (e.g., one of a nominal one-half inch drywall thickness or a nominal five-eighths inch drywall thickness).

In the configuration of FIGS. 18-20, in contrast with implementations described above, primary bracket 700 and support bracket 800 may be welded directly to sides of electrical box 10 without the use of additional welded (or "secondary") brackets (such as welded brackets 300 described above). FIG. 19 provides a top view of a portion of adjustable bracket assembly 600, while FIG. 20 provides a perspective view of primary bracket 700 in an uninstalled configuration.

In some aspects, primary bracket 700 may generally be configured similarly to primary bracket 200 described above. Referring collectively to FIGS. 18-20, primary bracket 700 may include a front panel (also referred to as a "first end panel") 702, a rear panel (also referred to as a "second end panel") 704, a mounting panel 706, and an adaptation panel 720. Each of front panel 702, rear panel 704, mounting panel 706, and adaptation panel 720 may include a set of ribs 208 to improve stiffness of primary bracket 200. Also, panels 704, 706, and 720 may be separated by score lines (e.g., score lines 222 and 224) and tabs (e.g., tabs 226 and 228) may be provided to selectively reinforce panel junctions with unbent score lines.

In contrast with primary bracket 200 described above, primary bracket 700 does not include an equivalent to upper flange 212 and lower flange 214, and some or all of mounting panel 706 may be in a different plane than the configuration of mounting panel 206. Also, in the implementation shown in FIG. 19, rear panel 704 may be divided into two sections (e.g., 704a and 704b) separated by an additional score line 708 with tabs 710 to selectively reinforce the panel junctions between section 704a and 704b. In one implementation, primary bracket 700 may be bent along score line 708 to provide additional length to accommodate thicker studs 20 (e.g., along the z-axis). Thus, in the embodiment shown in FIGS. 18-20, primary bracket 700 may accommodate studs of three different standard thicknesses. In another implementation, for example, section 704b may be bent around metal stud 20 (e.g., on a side opposite mounted electrical box 10) to avoid a projection of primary bracket 700 beyond the width of metal stud 20 (e.g., in the direction of the x-axis of FIG. 18).

As shown in FIG. 19, primary bracket 700 may be aligned to provide a particular depth, $D_1$, between front panel 702 and the face of electrical box 10. Depth $D_1$ may correspond, for example, to an installation depth for a wall surface of a single piece of drywall. Similarly, as shown in FIG. 18, support bracket 800 may be aligned to provide the same depth $D_1$ between a front flange 802 and the wall surface at the other side of electrical box 10. Support bracket 800 may also be configured to be slidably adjusted to align with the plane of rear panel 704. According to an implementation described herein, in a production environment, electrical boxes 10 may be manufactured and supplied with primary bracket 700 and support bracket 800 installed. Primary bracket 700 and support bracket 800 may be welded or otherwise secured to electrical box 10.

Implementations described herein provide an adjustable bracket assembly for mounting an electrical box behind a wall surface. In one implementation, the bracket assembly may include a primary bracket and a secondary bracket. The primary bracket may include a first end panel to be secured to a first surface of a stud; a second end panel to be secured to a second surface of the stud; a mounting panel having a top flange and bottom flange; and an adaptation panel configured to be selectively manipulated to position the front panel and the rear panel at a distance corresponding to either of a first stud depth or the second stud depth. The secondary bracket may be joined to an electrical box and may be configured to be secured within the top flange and the bottom flange. The secondary bracket, the top flange, and the bottom flange may be configured to provide multiple preconfigured mounting distances between the first end panel and a face of the electrical box.

In another implementation, an electrical box assembly may include an electrical box and a primary bracket. The primary bracket may include a first end panel configured to be secured to a first surface of a stud; a second end panel configured to be secured to a second surface of the stud and in a substantially parallel orientation to the first end panel; and mounting panel, joined to a first surface of the electrical box and located between the first end panel and the second end panel, the mounting panel having a length corresponding to a first stud depth. The primary bracket may also include an adaptation panel, between the mounting panel and the rear panel, having a length corresponding to a difference between the first stud depth and a second larger stud depth. The adaptation panel may be configured to be selectively manipulated to position the front panel and the rear panel at a distance corresponding to either of the first stud depth or the second stud depth.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments.

For example, although adjustable bracket assembly 100 has been shown with four standardized adjustments (e.g., single drywall, double drywall, single drywall with resilient bar, double drywall with resilient bar), in other implementations, more or fewer standardized adjustments may be provided. As another example, instead of particular holes 216/218 to define adjustment positions, longer slots may be provided with markings for adjustment positions.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An electrical box assembly, comprising:
    an electrical box; and
    a primary bracket including:
        a front panel configured to be secured by fasteners to a first side of a stud,
        a rear panel configured to be secured by fasteners to a second side of the stud and in a substantially parallel orientation to the front panel,
        a mounting panel, connected to an end of the front panel at a ninety-degree angle to the front panel and joined to the electrical box, the mounting panel having a length corresponding to a first stud depth, and
        an adaptation panel, connected at a first score line to an end of the mounting panel and connected at a second score line to an end of the rear panel, the adaptation panel having a length corresponding to a difference between the first stud depth and a second larger stud depth,
    wherein the primary bracket is selectively bent at the first score line or the second score line to set a distance between the front panel and the rear panel at a distance corresponding to either of the first stud depth or the second stud depth.

2. The electrical box assembly of claim 1, further comprising:
    a support bracket joined to the electrical box, wherein the support bracket is configured to contact a back side of a wall surface mounted to the second side of the stud when the electrical box is installed in the wall.

3. The electrical box assembly of claim 1, wherein the primary bracket is formed from a single piece.

4. The electrical box assembly of claim 1, wherein the front panel and the rear panel include a plurality of mounting holes configured to receive a fastener and thereby to position the secondary bracket at one of a range of distances from the stud.

5. The electrical box assembly of claim 1, wherein the front panel and the rear panel include a plurality of ribs extending along a length of the front panel and the rear panel.

6. The electrical box assembly of claim 1, wherein the primary bracket further includes a first score line between the mounting panel and the adaptation panel, and a second score line between the adaption panel and the rear panel.

7. The electrical box assembly of claim 6, wherein the primary bracket further includes a tab extending from an edge of the primary bracket at the second score line, and wherein the tab is configured to be selectively bent to reinforce a straight portion of the edge of the primary bracket extending from the adaption panel to the rear panel.

8. A bracket assembly for an electrical box, comprising:
    a primary bracket including:
        a front panel configured to be secured by fasteners to a first side of a stud,
        a rear panel configured to be secured by fasteners to a second side of the stud and in a substantially parallel orientation to the front panel,
        a mounting panel having a top flange and bottom flange, the mounting panel connected to an end of the front panel at a ninety-degree angle to the front panel and the mounting panel having a length corresponding to a first stud depth,
        an adaptation panel, connected at a first score line to an end of the mounting panel and connected at a second score line to an end of the rear panel, the adaptation panel having a length corresponding to a difference between the first stud depth and a second larger stud depth, wherein the primary bracket is selectively bent at the first score line or the second score line to set a distance between the front panel and the rear panel at a distance corresponding to either of the first stud depth or the second stud depth; and a secondary bracket secured to a side of the electrical box, the secondary bracket configured to be secured within the top flange and the bottom flange, wherein the secondary bracket, the top flange, and the bottom flange provide multiple preconfigured mounting distances between the front panel and a face of the electrical box.

9. The bracket assembly of claim 8, wherein the front panel and the rear panel include a plurality of mounting holes configured to receive a fastener and thereby to position the secondary bracket at one of a range of distances from the stud.

10. The bracket assembly of claim 8, wherein the multiple preconfigured mounting distances between the front panel and the face of the electrical box include a distance corresponding to a wall thickness with single drywall installation and a distance corresponding to a wall thickness with double drywall installation.

11. The bracket assembly of claim 10, wherein the multiple preconfigured mounting distances between the front panel and the face of the electrical box further include a distance corresponding to a wall thickness with single drywall installation with a resilient bar and a distance corresponding to a wall thickness with double drywall installation with a resilient bar.

12. The bracket assembly of claim 8, wherein the top flange includes one or more slots configured to receive a fastener from above the top flange, and wherein the bottom flange includes one or more slots configured to receive a fastener from below the bottom flange.

13. The bracket assembly of claim 12, wherein the secondary bracket includes a set of holes configured to align with the one or more slots of the top flange and the one or more slots of the bottom flange.

14. The bracket assembly of claim 8, wherein the top flange and the bottom flange each include one or more slots configured to permit adjustment of at least one of the multiple preconfigured mounting distances between a first distance, associated with a first standard drywall thickness, and a second distance, associated with a second standard drywall thickness.

15. The bracket assembly of claim 8, wherein the adaptation panel includes a plurality of ribs extending between the first score line and the second score line.

16. The bracket assembly of claim 8, wherein the primary bracket further includes a tab extending from an edge of the primary bracket at the second score line, and wherein the tab is configured to be selectively bent to reinforce a straight portion of the primary bracket extending from the adaption panel to the rear panel at the second score line.

17. The bracket assembly of claim 8, wherein the secondary bracket includes a plurality of welding embosses extending longitudinally from an edge of the secondary bracket.

18. A bracket assembly, comprising:
a primary bracket for mounting on a stud, the primary bracket including a mounting panel, the mounting panel having:
a top flange including a first plurality of slots, and
a bottom flange including a second plurality of slots substantially aligned with the first plurality of slots; and
a secondary bracket secured to the top flange and the bottom flange, the secondary bracket including:
a first hole to align with one of the first plurality of slots, and
a second hole to align with one of the second plurality of slots,
wherein the first hole and the second hole are each configured to receive a fastener to secure the primary bracket to the secondary bracket, and
wherein the secondary bracket, the top flange, and the bottom flange provide multiple preconfigured mounting depths for an electrical box attached to the secondary bracket relative to the stud.

19. The bracket assembly of claim 18, wherein the primary bracket is configured to be selectively adjusted for positioning the mounting panel, in a parallel orientation to the stud, for at least two standard-depth stud sizes.

20. The bracket assembly of claim 18, wherein the multiple preconfigured mounting depths include:
a distance corresponding to a wall surface, applied to the stud, with single drywall installation, and
a distance corresponding to a wall surface, applied to the stud, with single drywall installation and a resilient bar.

21. The bracket assembly of claim 20, wherein the multiple preconfigured mounting depths further include:
a distance corresponding to a wall surface, applied to the stud, with double drywall installation, and
a distance corresponding to a wall surface, applied to the stud, with double drywall installation and a resilient bar.

22. The bracket assembly of claim 18, wherein the mounting panel includes a plurality of ribs, and wherein the secondary bracket includes a set of protrusions configured to engage the plurality of ribs when the secondary bracket is secured to the top flange and the bottom flange.

23. The bracket assembly of claim 18, wherein the secondary bracket is joined to one side of the electrical box, and where the bracket assembly further comprises:
another bracket joined to another side of the electrical box, wherein the other bracket is configured to receive a support bracket that contacts a back side of a wall surface applied to the stud.

* * * * *